US010528076B2

(12) United States Patent
Gupta et al.

(10) Patent No.: US 10,528,076 B2
(45) Date of Patent: Jan. 7, 2020

(54) CLOCK RETIMING CIRCUIT

(71) Applicant: Western Digital Technologies, Inc., San Jose, CA (US)

(72) Inventors: Nitin Gupta, Noida (IN); Bhavin Odedara, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 302 days.

(21) Appl. No.: 15/824,026

(22) Filed: Nov. 28, 2017

(65) Prior Publication Data

US 2019/0163228 A1 May 30, 2019

(51) Int. Cl.
*G06F 1/08* (2006.01)
*G06F 1/12* (2006.01)
*H03L 7/14* (2006.01)

(52) U.S. Cl.
CPC ............ *G06F 1/08* (2013.01); *G06F 1/12* (2013.01); *H03L 7/14* (2013.01)

(58) Field of Classification Search
CPC ...... G06F 1/324; G06F 1/3203; G06F 1/3237; G06F 13/1668; G06F 1/08; G06F 1/26; G06F 1/3206; G06F 11/3409; Y02D 10/126; Y02D 10/128; H03L 2207/10; H03L 7/08; H03L 7/10
See application file for complete search history.

(56) References Cited

U.S. PATENT DOCUMENTS

| 4,953,185 | A | 8/1990 | Goode |
| 5,512,860 | A | 4/1996 | Huscroft et al. |
| 5,942,949 | A | 8/1999 | Wilson et al. |
| 5,943,613 | A | 8/1999 | Wendelrup et al. |
| 5,987,085 | A | 11/1999 | Anderson |
| 6,236,278 | B1 | 5/2001 | Olgaard |
| 6,295,327 | B1 | 9/2001 | Takla |
| 7,443,216 | B2 | 10/2008 | Gomm et al. |
| 2005/0046452 | A1 | 3/2005 | Briones |
| 2005/0189972 | A1 | 9/2005 | Foo et al. |
| 2011/0280109 | A1* | 11/2011 | Raymond ............ G04G 7/005 368/46 |
| 2015/0236705 | A1* | 8/2015 | Lee ..................... H03L 7/08 327/156 |
| 2017/0025161 | A1 | 1/2017 | Min |

* cited by examiner

*Primary Examiner* — Jaweed A Abbaszadeh
*Assistant Examiner* — Brian J Corcoran
(74) *Attorney, Agent, or Firm* — Vierra Magen Marcus LLP

(57) ABSTRACT

A clock retiming circuit and method of operating a clock retiming circuit are described herein. A clock retiming circuit generates a retimed clock based on an input clock. The clock retiming circuit may have a normal mode when the input clock is available to the clock retiming circuit, and a retention mode that is entered in response to the input clock no longer being present. The clock retiming circuit resumes the normal mode in response to the clock again being present. The retention mode is a low current mode, in one aspect. Thus, the clock retiming circuit may operate in a low current mode when the input clock is not available. The clock retiming circuit may be tolerant to loss of the input clock. The clock retiming circuit may quickly re-establish the retimed clock in response to the input clock again becoming available.

20 Claims, 11 Drawing Sheets

CLOCK RETIMING CIRCUIT

BACKGROUND

In electronics, a clock is a signal that oscillates between two states. It is common for the clock to oscillate between two voltage magnitudes. The clock may be used to control activity in an electronic circuit such as a digital circuit. For example, a clock may be used to coordinate data transfer. However, clocks have many other uses.

BRIEF DESCRIPTION OF THE DRAWINGS

Like-numbered elements refer to common components in the different figures.

DETAILED DESCRIPTION

A clock retiming circuit and method of operating a clock retiming circuit are described herein. One embodiment of a clock retiming circuit generates a retimed clock based on a frequency of an input clock. From time to time the input clock might not be available to the clock retiming circuit. One possible reason for the loss of the clock is that data is not being transferred at that time. Note that the input clock could be a data strobe signal. One embodiment of the clock retiming circuit has a normal mode when the input clock is available to the clock retiming circuit, and a retention mode that is entered in response to the input clock no longer being present. The clock retiming circuit resumes the normal mode in response to the clock again being present. The retention mode is a low current mode, in one embodiment. Thus, the clock retiming circuit may operate in a low current mode when the input clock is not available. One embodiment of the clock retiming circuit is tolerant to loss of the input clock. The clock retiming circuit may quickly re-establish the retimed clock in response to the input clock again becoming available. In one embodiment, the clock retiming circuit re-establishes the retimed clock within tens of clock cycles of the input clock.

Figure 1A:
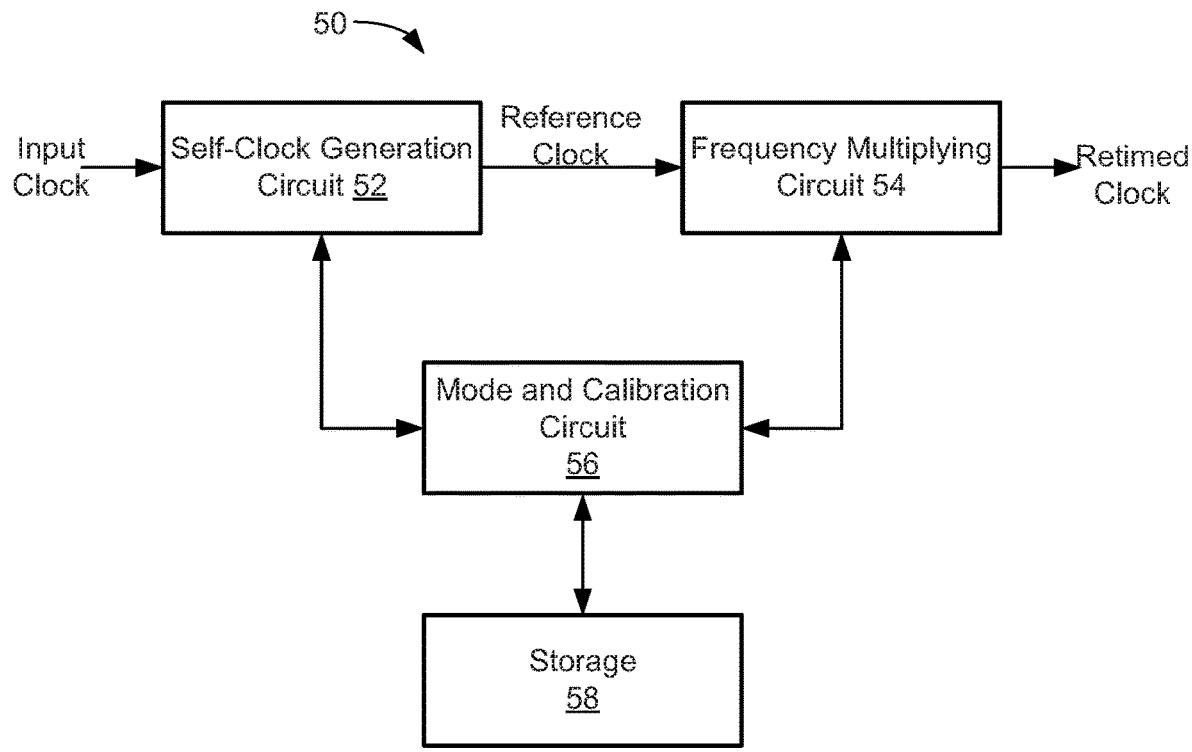
FIG. 1A is a diagram of one embodiment of a clock retiming circuit.

FIG. 1A is a diagram of one embodiment of a clock retiming circuit 50 (or more simply "retiming circuit"). The retiming circuit 50 includes a self-clock generation circuit 52, a frequency multiplying circuit 54, a mode and calibration circuit 56, and storage 58. Note that storage 58 could be volatile storage or non-volatile storage. In general, storage 58 may be any non-transitory storage. In general, the retiming circuit 50 receives an input clock and generates a retimed clock. The retimed clock has some desired relationship to the input clock. For example, the retimed clock may have the same frequency as the input clock. However, having the same exact frequency is not required. In one embodiment, the retimed clock has a frequency that is slightly greater than the input clock. For example, the retimed clock frequency might be 5 to 10 percent higher than the frequency of the input clock. Also note that one embodiment of the retiming circuit produces multiple retimed clocks, based on the input clock. For example, one embodiment of the retiming circuit produces two retimed clocks having the same frequency but 90 degrees out of phase from each other. One embodiment of the retiming circuit produces two retimed clocks having different frequencies. For example, one retimed clock could have half the frequency of the other retimed clock.

The self-clock generation circuit 52 receives the input clock and outputs a reference clock. The self-clock generation circuit 52 is configured to detect a frequency of the input clock, in one embodiment. The self-clock generation circuit 52 may be configured to cause the frequency of the reference clock to have some desired relationship to the input clock. For example, the reference clock might have the same frequency as the input clock, one-half the frequency of the input clock, one-quarter the frequency of the input clock, etc. In one embodiment, the self-clock generation circuit 52 attempts to have the reference clock frequency match the input clock frequency. If the reference clock frequency matches the input clock frequency, then the frequency multiplying circuit 54 could be bypassed, in one embodiment. However, the self-clock generation circuit 52 might instead cause the reference clock frequency to be some fraction of the input clock frequency.

Note that the self-clock generation circuit 52 does not need to have a reference clock (such as input clock) in order to generate its output clock (e.g., reference clock). Moreover, note that the self-clock generation circuit 52 can output a reference clock having some desired frequency relationship to the input clock, even though the input clock is not present. Thus, once the self-clock generation circuit 52 determines the frequency of the input clock, the self-clock generation circuit 52 is able to continue to generate the reference clock, even if the input clock is no longer present. The self-clock generation circuit 52 could include a high-frequency oscillator, a high-frequency relaxation oscillator, an RC oscillator circuit, an LC oscillator circuit, etc. The self-clock generation circuit 52 may include other hardware and/or software, such as a state machine.

In one embodiment, trim settings for causing the self-clock generation circuit 52 to generate the reference clock having a desired frequency are determined and stored in storage 58. Note, however, that the self-clock generation circuit 52 may be sensitive to changes in voltage and/or temperature. Thus, the frequency of the reference clock could vary if there are changes in voltage and/or temperature. Thus, the frequency of the reference clock might not be the same throughout time. However, the variance of the reference clock frequency is tolerable, in accordance with embodiments. For example, over the range of typical operating voltage and temperature, the variance in reference clock frequency is within about 5%, in one embodiment. As will be discussed below, one embodiment of the frequency multiplying circuit 54 compensates for possible variance of the reference clock frequency.

The frequency multiplying circuit 54 receives the reference clock and generates a retimed clock based on the reference clock. The retimed clock has a higher frequency than the reference clock, in one embodiment. For example, the retimed clock might be twice the frequency of the reference clock, four times the frequency of the reference clock, etc. In one embodiment, the frequency multiplying circuit 54 increases the frequency of the reference clock to compensate for the self-clock generation circuit 52 producing a lower frequency clock than the input clock. For example, the input clock frequency may be 1600 MHz, the reference clock frequency may be 800 MHz, and the retimed clock may be 1600 MHz. Thus, the retimed clock may have about the same frequency as the input clock. As will be discussed in the next paragraph, in some embodiments, the retimed clock frequency is about the same or slightly greater than (e.g., up to 10 percent greater) the input clock frequency.

As noted above, the reference clock frequency may vary slightly with voltage and/or temperature. In one embodiment, the frequency multiplying circuit 54 compensates for a worst expected case by upping the frequency of the retimed clock slightly relative to the reference clock. For example, if the input clock may has a frequency of 1600 MHz, the target frequency of the reference clock might be 800 MHz. In this case, the frequency multiplying circuit 54 could double the frequency of the reference clock to cause the retimed clock to have a frequency of 1600 MHz. However, in anticipation of the reference clock possibly being somewhat below 800 MHz, the frequency multiplying circuit 54 slightly more than doubles the frequency of the reference clock. It may be that this results in the retimed clock having a frequency that is slightly greater than the input clock; however, this condition is tolerable for many if not most applications. For example, the retimed clock may still be able to meeting timing constraints when transferring data. For some application, if the retimed clock has a lower frequency than the input clock, data transfer could be negatively impacted. For example, the rate at which data is transferred out (by the retimed clock) might fall behind the rate that data is transferred in (by the input clock).

Note that the frequency multiplying circuit 54 might need to have a reference clock in order to generate the retimed clock. The frequency multiplying circuit 54 is configured to lock to the reference clock, in one embodiment. The frequency multiplying circuit 54 could include, for example, a phase-locked loop, a delay-locked loop, or a frequency-locked loop.

From time to time, the input clock might not be present. The retiming circuit 50 is able to continue to provide the retimed clock for some pre-determined number of clock cycles after the input clock is no longer present, in one embodiment. This may allow circuits that depend on the retimed clock to perform tasks that need to be done after the input clock is no longer present. For example, data could continue to be transferred after the input clock is no longer present.

The retiming circuit 50 goes into a retention mode in response to the input clock no longer being present, in one embodiment. During one embodiment of the retention mode, the retiming circuit 50 has very low current consumption. During one embodiment of the retention mode, the retiming circuit 50 has very low power consumption.

The mode and calibration circuit 56 is configured to detect the loss of the input clock, in one embodiment. The calibration circuit 56 initiates the retention mode in response to the loss of the input clock, in one embodiment. The calibration circuit 56 shuts down the self-clock generation circuit 52, during at least a portion of the retention mode, in one embodiment. More generally, the calibration circuit 56 may cause the self-clock generation circuit 52 to enter a low current and/or power mode, during at least a portion of the retention mode, in one embodiment. In the low current and/or power mode, the self-clock generation circuit 52 does not output the reference clock.

When the input clock again becomes present, it is desirable for the frequency multiplying circuit 54 to quickly lock to the reference signal, such that an accurate retimed clock can be quickly produced. The retiming circuit 50 is configured to enable fast locking of the frequency multiplying circuit 54 in response to the input clock again becoming present.

Note that the reference clock is not available when the self-clock generation circuit 52 is not active. Thus, the frequency multiplying circuit 54 will lose the lock to the reference clock. During the retention mode, conditions (e.g., temperature, voltage) that impact operation of the frequency multiplying circuit 54 may change. Such changed conditions may impact trim settings of the frequency multiplying circuit 54. The calibration circuit 56 is configured to periodically re-activate the self-clock generation circuit 52 during a calibration period of the retention mode, such that it provides the reference clock to the frequency multiplying circuit 54. The frequency multiplying circuit 54 is configured to re-lock to the reference clock during the calibration period. The calibration circuit 56 is configured to save calibration values from the frequency multiplying circuit locking to the reference clock. The calibration values are saved to the storage 58, in one embodiment. Thus, the retiming circuit 50 continues to adapt to changing conditions during the retention mode. When the input clock is again present, the retiming circuit may enter a normal mode of operation. At the start of the normal mode, the saved trim settings may be used to initialize the frequency multiplying circuit 54. Thus, the frequency multiplying circuit 54 is able to obtain a fast lock to the reference clock. Thus, the retiming circuit 50 is able to both save current and/or power during the retention mode, and to still have fast locking of the frequency multiplying circuit 54 when leaving the retention mode.

Figure 1B:
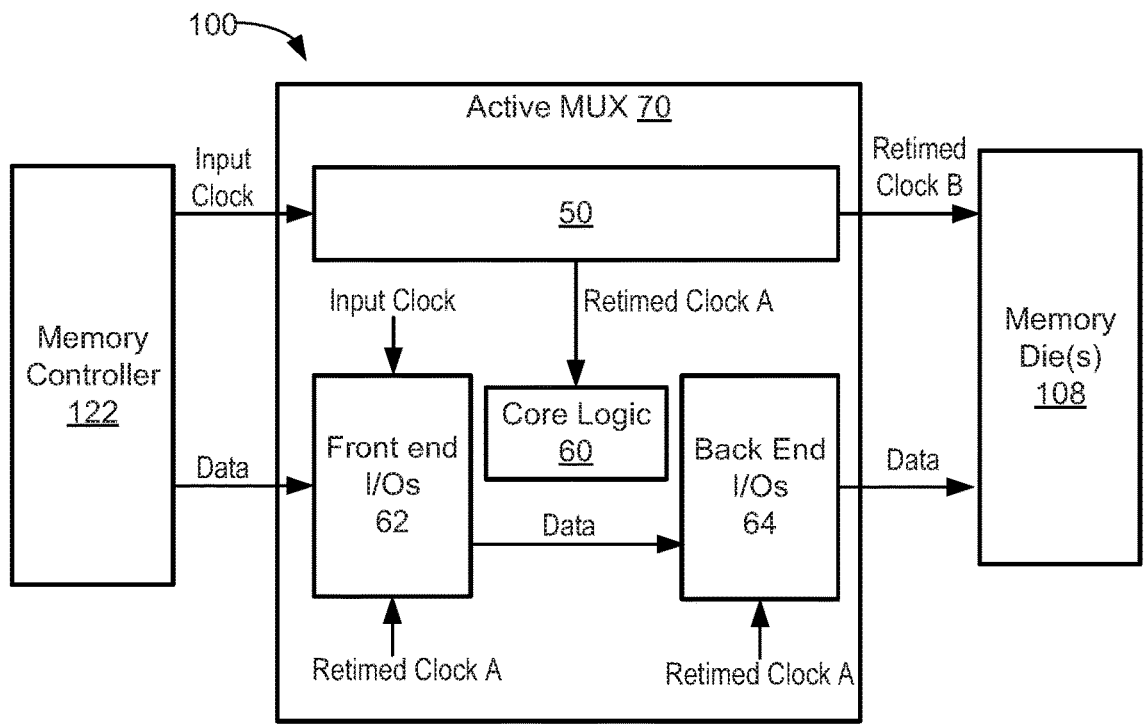
FIG. 1B is a diagram of one embodiment of a memory system having a retiming circuit.

The retiming circuit 50 of FIG. 1A has many possible applications. One application is within a memory system. FIG. 1B is a diagram of one embodiment of a memory system 100 having a retiming circuit 50. The retiming circuit 50 is used within an active MUX 70 (or interface circuit), which is between a memory controller 122 and one or more memory dies 108. In one embodiment, the memory controller 122, the active MUX 70, and each of the memory dies 108 is on a separate semiconductor die. In one embodiment, the active MUX 70 and the memory dies 108 are within the same semiconductor package, which may help to reduce parasitic capacitance. In one embodiment, memory system 100 may be a card based system, such as a secure digital (SD) or a micro secure digital (micro-SD) card. In an alternate embodiment, memory system 100 may be part of an embedded memory system. In other example, memory system 100 can be in the form of a solid state drive (SSD) drive.

The active MUX 70 is used to facilitate data transfer between the memory controller 122 and memory die(s) 108. Note that the memory system could have multiple memory dies 108 connected to the active MUX 70. The memory die(s) 108 could contain a wide variety of types of memory cells including, but not limited to, NAND, NOR, and ReRAM. In one embodiment, the memory die(s) 108 contains DRAM.

The active MUX 70 includes the retiming circuit 50, front end I/Os 62, back end I/Os 64, and core logic 60. In one embodiment, the front end I/Os 62 contain first-in, first out (FIFO) data buffers. In one embodiment, the back end I/Os 64 contain first-in, first out (FIFO) data buffers. In one embodiment, the back end I/Os 64 contain flip flops that serve as data latches. Data from the memory controller 122 is transferred into the front end I/Os 62, in one embodiment. Data from front end I/Os 62 is transferred to back end I/Os 64, in one embodiment. Data from the back end I/Os 64 is transferred to the memory dies 108, in one embodiment.

The retiming circuit 50 receives the input clock from the memory controller 122 and provides a retimed clock A to the core logic 60. The core logic 60 performs a variety of functions such as transferring data from one domain to another. The core logic 60 writes data into FIFOs and reads data from FIFOs, in one embodiment. At least some of the FIFOs may be in front end I/Os 62. The core logic 60 detects whether or not there is an input clock present, in one embodiment. The core logic 60 can be implemented in hardware, software, or some combination of hardware and software. The core logic 60 includes a state machine, in one embodiment. The core logic 60 may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, core logic 60 may include software stored in a processor readable device (e.g., memory) to program a processor for core logic 60 to perform some of the functions described herein such as, but not limited to, detecting the input clock, and causing the retiming circuit to operate in either a normal mode or a retention mode.

The retimed clock A may be used to clock data out of front end I/Os 62 and into back end I/Os 64. Retimed clock A is provided to back end I/Os 64, in one embodiment. Retimed clock A may be used to clock data out of back end I/Os 64. In one embodiment, the retiming circuit 50 generates a retimed clock B. Retimed clock B is provided to one or more memory dies 108. In one embodiment, retimed clock B is a delayed version of retimed clock A.

In one embodiment, the interface between the memory controller 122 and the active MUX 70 is compliant with a version of the Open NAND Interface (ONFI) Specification. Likewise, the interface between the active MUX 70 and the memory die 108 is compliant with a version of the ONFI specification, in one embodiment. The interface(s) are flash Toggle Mode interfaces, in one embodiment. For example, the interfaces may be Toggle Mode 400, 800, or 1600. The interface(s) are not limited to Flash memory.

In one embodiment, the input clock is a data strobe signal. In one embodiment, the input clock is a DQS signal, as the term is used in the ONFI specification. Note that the DQS signal may be used as a data strobe signal. Also, note that the input clock may be used as a data strobe signal that is compliant with a specification other than the ONFI specification. For example, the data strobe signal might be used to facilitate data transfer to DRAM.

Figure 2:
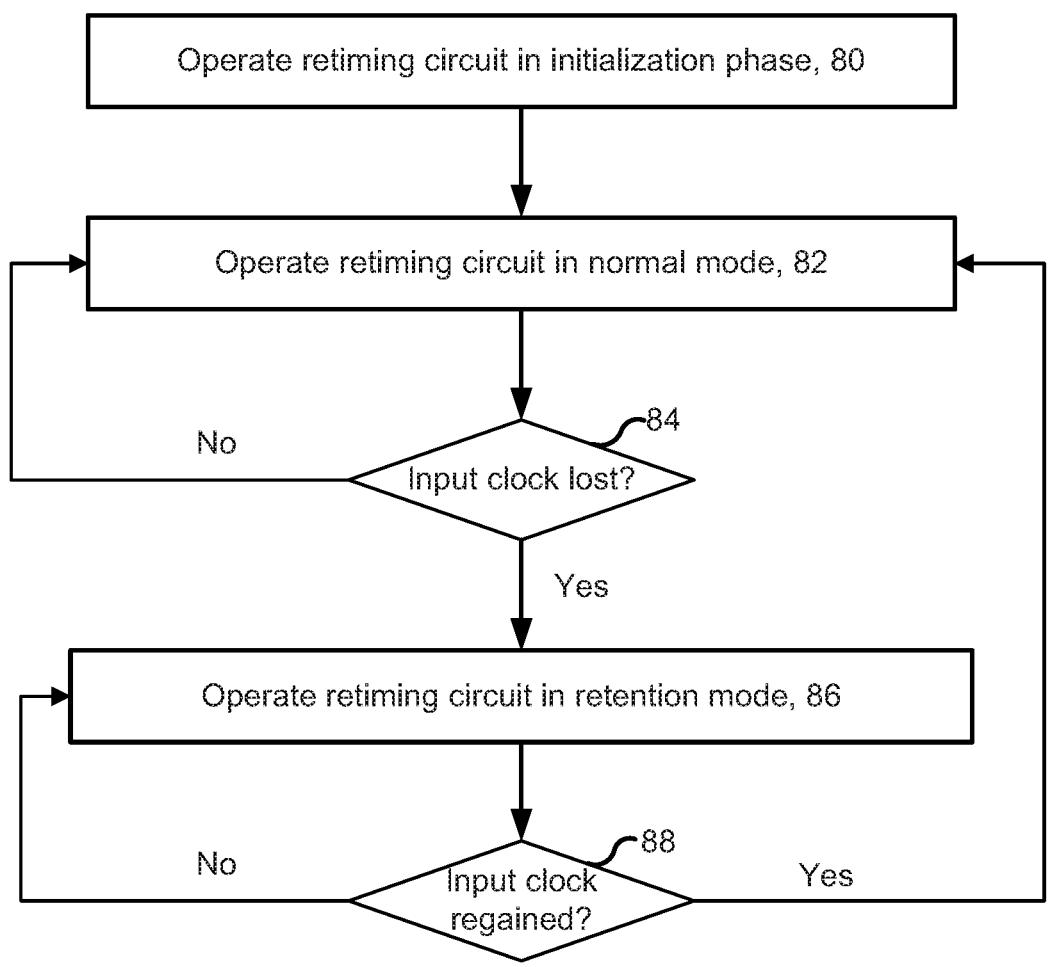
FIG. 2 is a flowchart of one embodiment of a process of operating a retiming circuit in a normal mode and a retention mode.

One embodiment of retiming circuit 50 has a normal mode and a retention mode. FIG. 2 is a flowchart of one embodiment of a process 75 of operating a retiming circuit 50 in a normal mode and a retention mode. The process 75 may be performed by retiming circuit of FIG. 1A. The process 75 could be performed within a memory system (such as the system of FIG. 1B), but is not limited to a memory system. The process 75 may be performed by retiming circuit 700 shown in FIG. 7 or retiming circuit 800 shown in FIG. 8.

Step 80 is to operate the retiming circuit 50 in an initialization phase. Step 80 could be performed in response to a power on reset. The initialization phase may also be referred to as a training phase. In general, one embodiment of the initialization phase includes obtaining initial parameters for operating the retiming circuit 50. Prior to step 80, the frequency of the input clock is not known by the retiming circuit 50, in one embodiment. Hence, step 80 may include the self-clock generation circuit 52 learning the frequency of the input clock. Step 80 may also include locking the frequency multiplying circuit 54 to the reference clock. Step 80 may also include saving various trim settings for both the self-clock generation circuit 52 and the frequency multiplying circuit 54. Further details of one embodiment of an initialization phase are discussed with respect to process 400 in FIG. 4.

Step 82 includes operating the retiming circuit 50 in a normal mode. The retiming circuit 50 is operated in the normal mode until the input clock is lost (step 84=yes). As long as the input clock remains present, the retiming circuit 50 stays in the normal mode. During one embodiment of the normal mode, the controller 122 provides data to the Active MUX 70. Moreover, the Active MUX 70 provides that data to one or more memory die 108, in one embodiment. Further details of one embodiment of a normal mode are discussed with respect to process 600 in FIG. 6.

Step 86 includes operating the retiming circuit 50 in a retention mode. During the retention mode, the retiming circuit 50 may be operated in a low current mode. During the retention mode, the retiming circuit 50 may be operated in a low power mode. During the retention mode, the frequency multiplying circuit 54 may be periodically calibrated. For example, the frequency multiplying circuit 54 may be periodically re-locked to the reference clock. Moreover, parameters from re-locking to the reference clock may be saved in storage 58.

Note that the retention mode may be entered responsive to loss of the input clock (step 84=yes). The retiming circuit 50 continues to be operated in the retention mode until the input clock is again regained (step 88=yes). Responsive to regaining the input clock, the retiming circuit 50 is again operated in the normal mode. The parameters from re-locking the frequency multiplying circuit 54 to the reference clock may be retrieved from storage 58 to enable fast locking of the frequency multiplying circuit 54. Further details of one embodiment of a retention mode are discussed with respect to process 500 in FIG. 5.

Figure 3A:
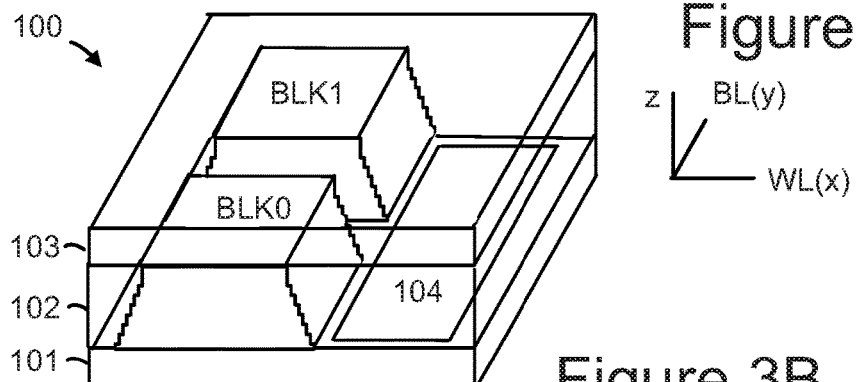
FIGS. 3A and 3B describe one example of a memory system that can be used to implement the technology described herein.
Figure 3B:
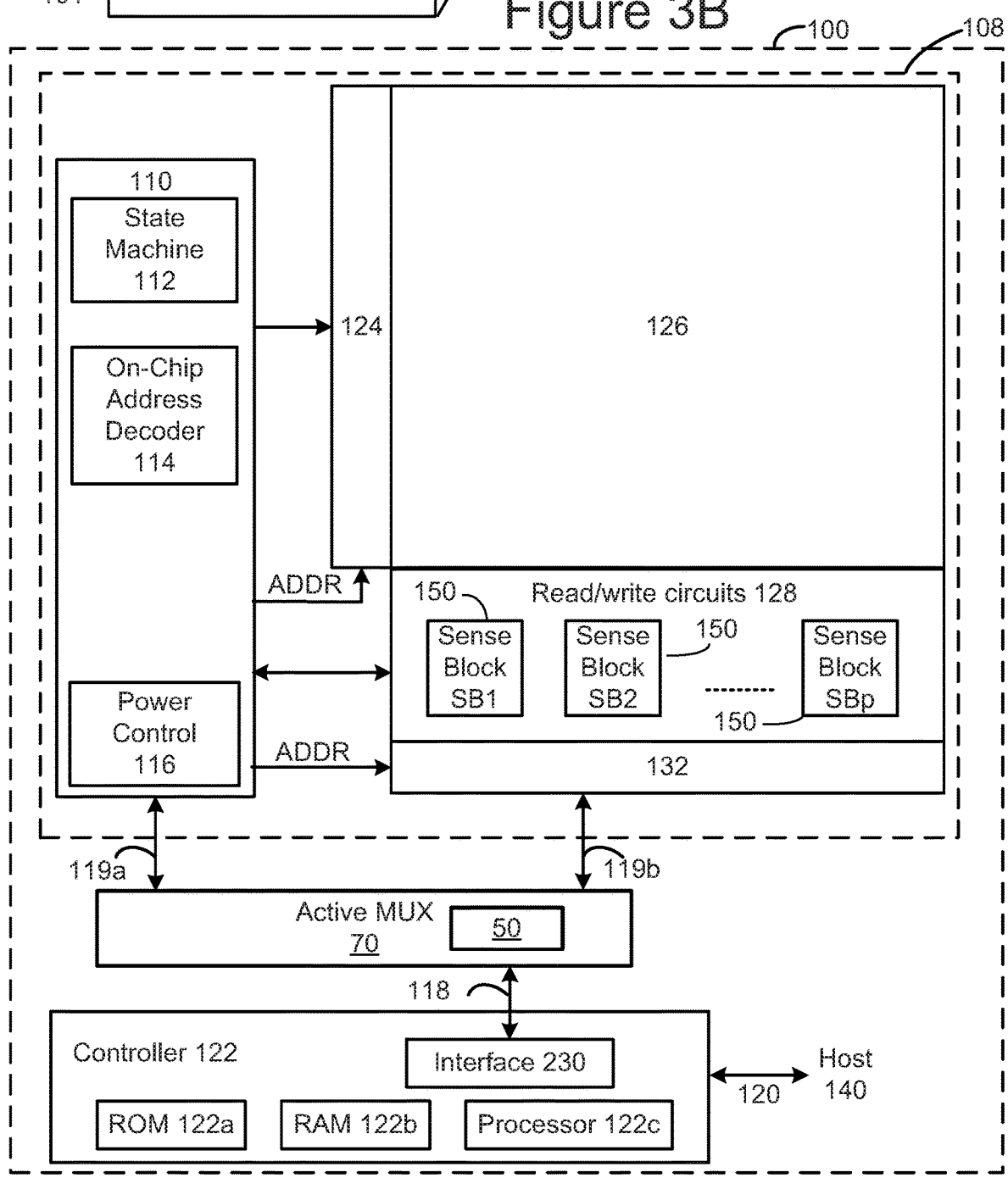

FIGS. 3A and 3B describe one example of a memory system that can be used to implement the technology proposed herein. FIG. 3A is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 3B is a functional block diagram of an example memory device such as the 3D stacked non-volatile memory device 100 of FIG. 3A. The components depicted in FIG. 3B are electrical circuits. Memory device 100 includes an Active MUX 70 between a controller 122 and one or more memory die 108. Note that the Active MUX 70 includes a retiming circuit 50. Each memory die 108 includes a two dimensional or a three dimensional memory structure 126 of memory cells (such as, for example, a 3D array of memory cells), control circuitry 110, and read/write circuits 128. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120. Commands and data are transferred between controller 122 and the retiming circuit via lines 118. Commands and data are transferred between retiming circuit and the one or more memory die 108 via lines 119a, 119b. Note that the commands and data may include control signals such as a clock.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, and controller 122 can be considered a control circuit.

The (on-chip or off-chip) controller 122 (which in one embodiment is an electrical circuit) may comprise one or more processors 122c, ROM 122a, RAM 122b, Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

The components of controller 122 depicted in FIG. 3B may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein.

Figure 4:
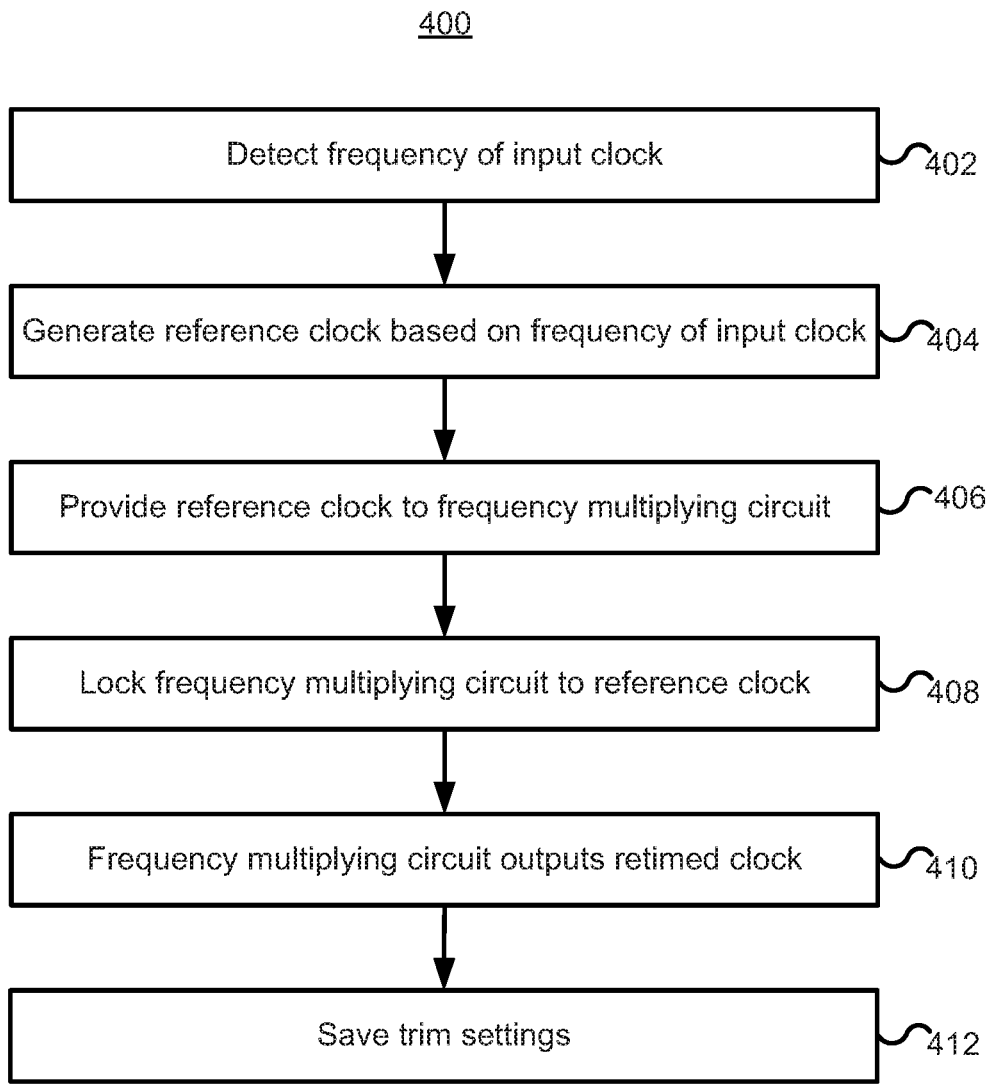
FIG. 4 is a flowchart of one embodiment of a process of operating a retiming circuit during an initialization phase.

FIG. 4 is a flowchart of one embodiment of a process 400 of operating a retiming circuit 50 during an initialization phase. Process 400 is one embodiment of step 80 of process 75 in FIG. 2. The process 400 may be performed by retiming circuit of FIG. 1A. The process 400 could be performed within a memory system (such as the system of FIG. 1B or FIG. 11), but is not limited to a memory system. The process 400 may be performed by retiming circuit 700 shown in FIG. 7 or retiming circuit 800 shown in FIG. 8. Process 400 is performed in response to a power on reset, in one embodiment. For example, process 400 could be performed in response to a power on reset of a memory system.

Step 402 includes detecting a frequency of an input clock. In one embodiment, self-clock generation circuit 52 detects the frequency of the input clock. Note that the frequency of the input clock could potentially change after each time there is a power on reset.

Step 404 includes generating a reference clock based on the frequency of the input clock. In one embodiment, self-clock generation circuit 52 generates the reference clock based on the frequency of the input clock. In one embodiment, the self-clock generation circuit 52 generates a reference clock that has a frequency that is some fraction of the input clock frequency, such as one-half the frequency of the input clock, one-quarter the frequency of the input clock, etc.

Step 406 includes providing the reference clock to a frequency multiplying circuit 54. For example, with respect to the retiming circuit 50 in FIG. 1A, the output of the self-clock generation circuit 52 may be connected to the input of the frequency multiplying circuit 54, such that whenever the self-clock generation circuit 52 outputs the reference clock, the reference clock is provided to the frequency multiplying circuit 54.

Step 408 includes the frequency multiplying circuit 54 locking to the reference clock. Note that step 408 may also include the frequency multiplying circuit 54 generating a retimed clock. The retimed clock frequency is based on a multiple of the reference clock frequency, in one embodiment. Moreover, the retimed clock frequency is stepped up slightly to compensate for possible voltage or temperature induced changes to the reference clock frequency, in one embodiment.

Step 410 includes the frequency multiplying circuit 54 outputting a retimed clock. The retimed clock has a frequency that is based on a multiple of the reference clock frequency, in one embodiment. As noted herein the retimed clock frequency could be a few percent higher than, for example, double the reference clock frequency. Hence, the retimed clock is based on the reference clock frequency, but is not required to be an example multiple of the reference clock frequency.

Step 412 includes saving trim settings. The trim settings may be saved to storage 58. Step 412 may include saving trim settings for the self-clock generation circuit 52. These trim settings may later be used to cause the self-clock generation circuit 52 to output a reference clock having about the same frequency as it did in step 404. Note, however, that the self-clock generation circuit 52 may be sensitive to changes in voltage and/or temperature. Thus, the frequency of the reference clock could vary if there are changes in voltage and/or temperature. This means that it is not required that the frequency of the reference clock be the same throughout time. Stated another way, it is not required that the frequency of the reference clock be the same each time that the saved trim settings are applied.

Step 412 may include saving trim settings for the frequency multiplying circuit 54. These trim settings may be used to help the frequency multiplying circuit 54 to achieve a faster lock to the reference clock. The trim settings for the frequency multiplying circuit 54 are also referred to herein as calibration values from locking the frequency multiplying circuit 54 to the reference clock.

Figure 5:
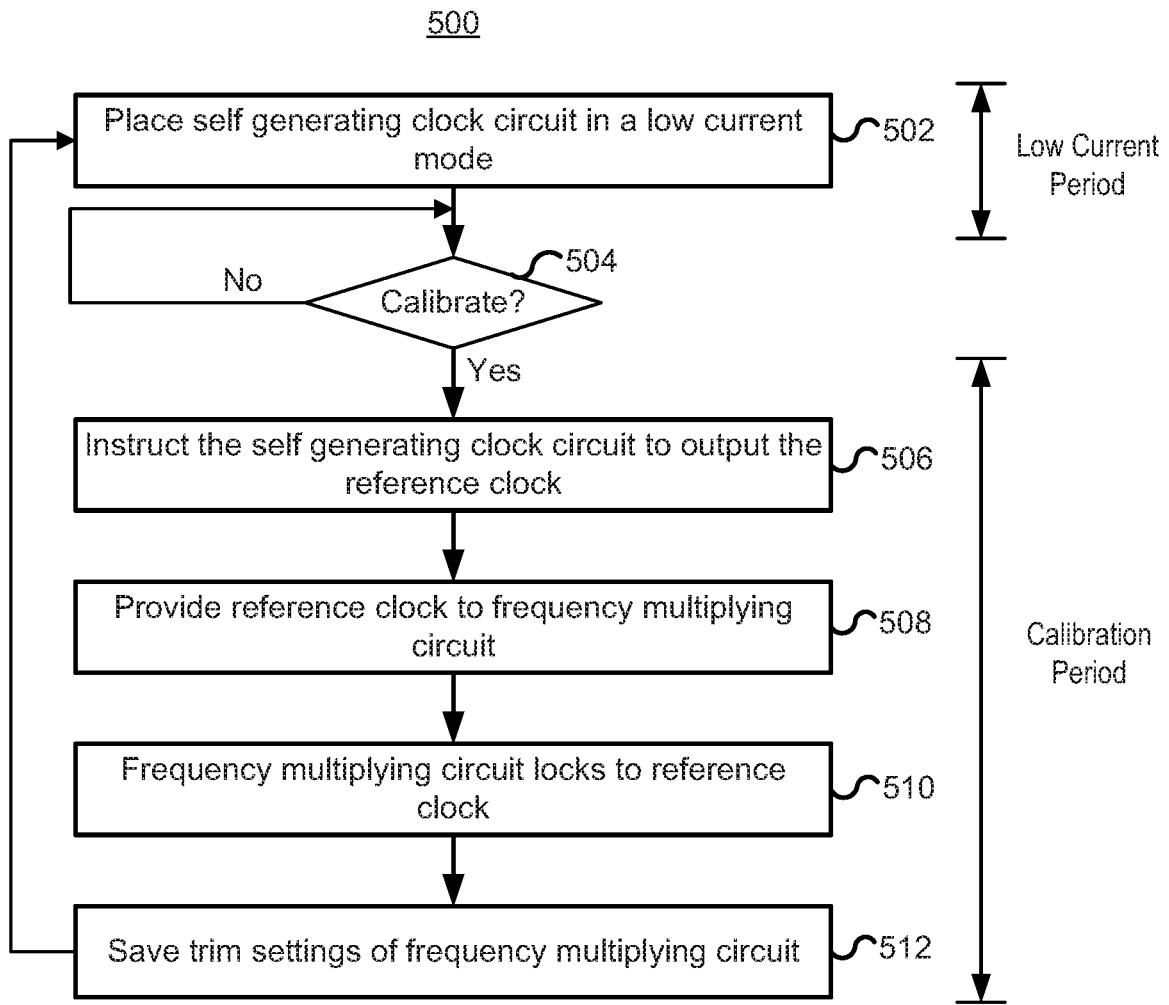
FIG. 5 is a flowchart of one embodiment of a process of operating a retiming circuit during a retention mode.

FIG. 5 is a flowchart of one embodiment of a process 500 of operating a retiming circuit 50 during a retention mode. Process 500 is one embodiment of step 86 of process 75 in FIG. 2. The process 500 may be performed by retiming circuit of FIG. 1A. The process 500 could be performed within a memory system (such as the system of FIG. 1B or FIG. 11), but is not limited to a memory system. The process 500 may be performed by retiming circuit 700 shown in FIG. 7 or retiming circuit 800 shown in FIG. 8. Note that the process 500 is divided between a low current period and a calibration period.

Step 502 includes putting the self-clock generation circuit 52 into a low current mode. One possibility in step 502 is to shut down the self-clock generation circuit 52, such that no current is consumed. But is it not required to completely shut down the self-clock generation circuit 52. Step 502 includes instructing the self-clock generation circuit 52 to stop generating the reference clock, in one embodiment. Note that the self-clock generation circuit 52 might consume a considerable amount of current when it is generating the reference clock. Thus, by not generating the reference clock considerable current savings is achieved. Other circuitry in the retiming circuit 50 could also be placed into a low current mode to save additional current and/or power. For example, the frequency multiplying circuit 54 may also be placed into a low current mode by, for example, instruction the frequency multiplying circuit 54 to stop generating the retimed clock. The self-clock generation circuit 52 stays shut down for most of the retention phase, in one embodiment.

Figure 8:
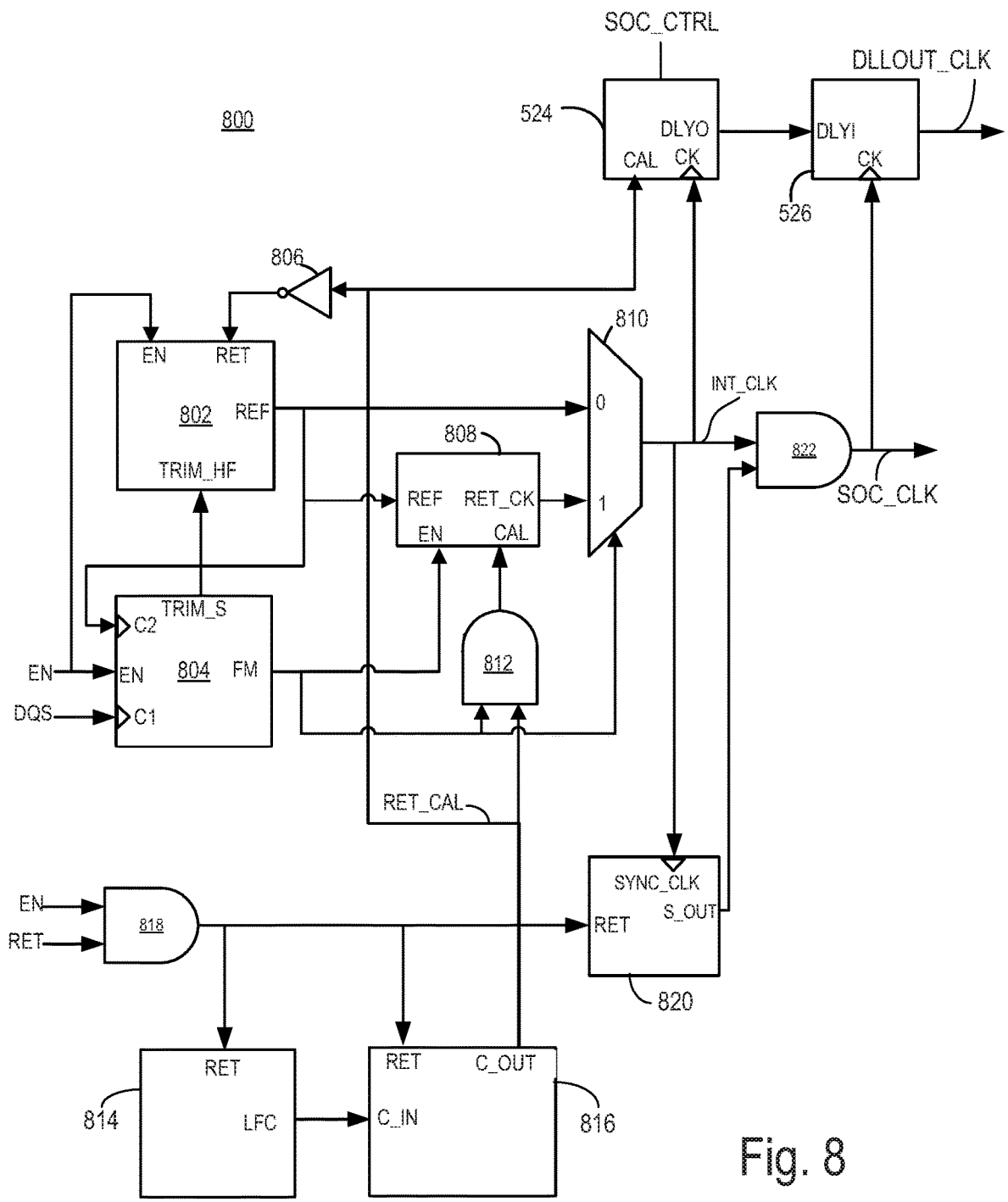
FIG. 8 is a diagram of one embodiment of a retiming circuit.

Step 504 is a determination of whether to calibrate the frequency multiplying circuit 54. In one embodiment, the calibration is performed periodically. In one embodiment, mode and calibration circuit 56 generates a signal having two states. One state demarks the low current period and one state demarks the calibration period, in one embodiment. The signal has a certain period and a certain duty cycle, in one embodiment. For example, the signal may have a period of 1 second and a duty cycle of 1 percent. In this case, the calibration period may be performed once per second. Moreover, the calibration period may last for 0.01 seconds. The period and duty cycle are programmable, in one embodiment. Hardware and/or software may be used to periodically start the calibration process. FIG. 8 depicts one embodiment of a retiming circuit that makes the determination. Steps 506-512 take place during the calibration period.

Step 506 is to instruct the self-clock generation circuit 52 to output the reference clock. As noted, the self-clock generation circuit 52 does not need an input clock to generate the reference clock. The trim settings that were saved in step 412 may be applied to the self-clock generation circuit 52 to establish the desired frequency for the reference clock. Note that the self-clock generation circuit 52 may be sensitive to changes in voltage and/or temperature. Thus, the frequency of the reference clock could vary if there are changes in voltage and/or temperature. This means that it is not required that the frequency of the reference clock be the same as it was in the initialization phase (e.g., step 404 of process 400). The frequency of the reference clock could be slightly below, the same, or slightly above the frequency in the initialization phase.

Step 508 is to provide the reference clock to the frequency multiplying circuit 54. In one embodiment, the output of the self-clock generation circuit 52 is connected to the input of the frequency multiplying circuit 54, such that step 508 happens in response to the self-clock generation circuit 52 outputting the reference clock.

Step 510 includes the frequency multiplying circuit 54 locking to the reference clock. Note that the most recently saved trim settings of the frequency multiplying circuit 54 may be used in order to facilitate rapid locking. Step 510 may also include the frequency multiplying circuit 54 generating a retimed clock. The retimed clock frequency is based on a multiple of the reference clock frequency, in one embodiment. Moreover, the retimed clock frequency is stepped up slightly to compensate for possible voltage or temperature induced changes to the reference clock frequency, in one embodiment.

Step 512 includes saving trim settings (or calibration values) of the frequency multiplying circuit 54. In one embodiment, mode and calibration circuit 56 saves the trim settings to storage 58. After step 512, the process 500 returns to step 502 to again place the self-clock generation circuit 52 in the low current mode. Note that the self-clock generation circuit 52 stops generating the reference clock during the low current mode. Note that other circuitry including, but not limited to, the frequency multiplying circuit 54 may also be shut down during the low current mode. Note that the retention mode continues until the input clock is again present, in one embodiment. The input clock could return at any time during the retention mode.

Figure 6:
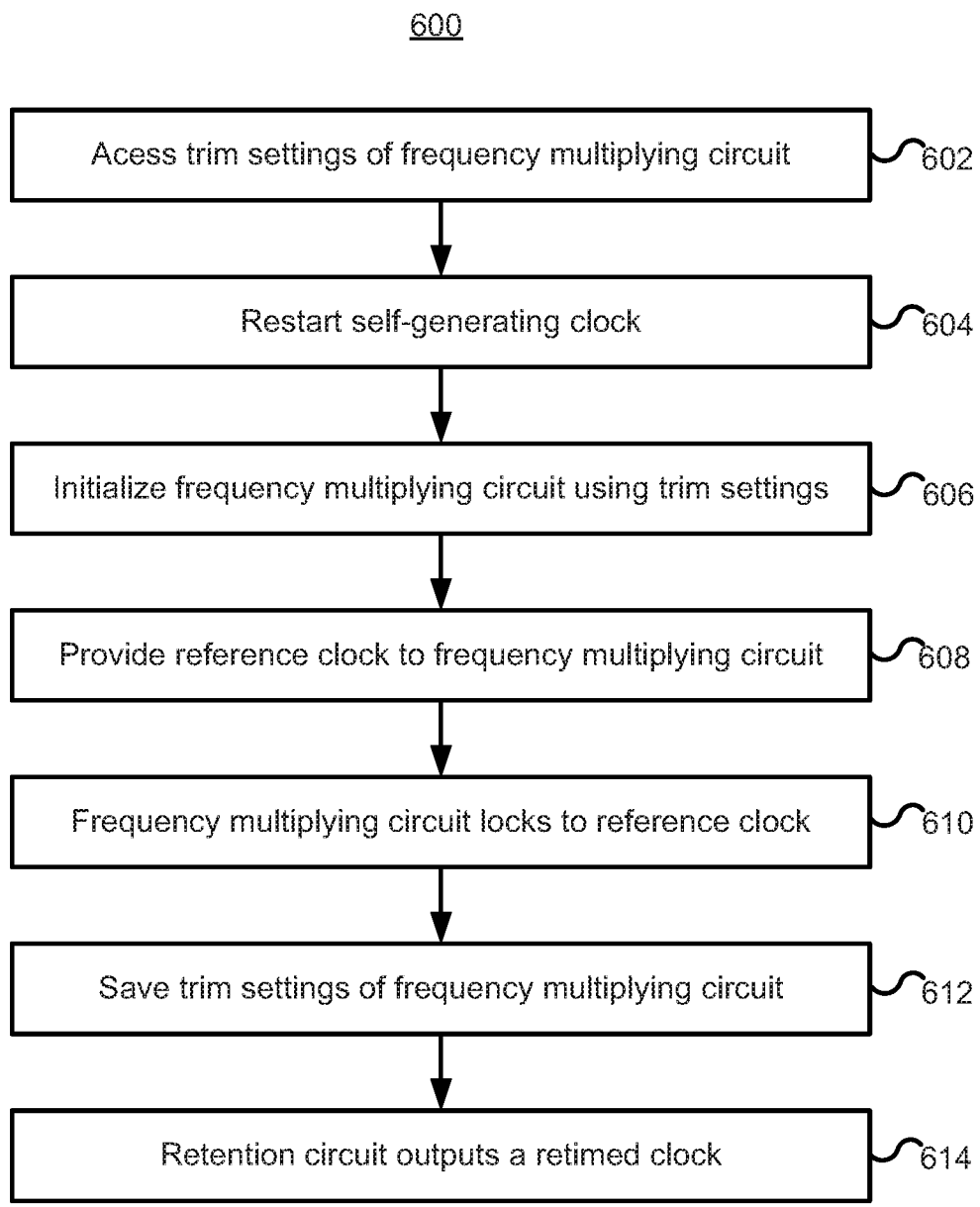
FIG. 6 is a flowchart of one embodiment of a process of operating a retiming circuit during a normal mode.

FIG. 6 is a flowchart of one embodiment of a process 600 of operating a retiming circuit 50 during a normal mode. Process 600 is one embodiment of step 82 of process 75 in FIG. 2. The process 600 may be performed by retiming circuit of FIG. 1A. The process 600 could be performed within a memory system (such as the system of FIG. 1B or FIG. 11), but is not limited to a memory system. The process 600 may be performed by retiming circuit 700 shown in FIG. 7 or retiming circuit 800 shown in FIG. 8. Note that process 600 is performed in response to the return of the input clock, which could happen at any point of the retention mode.

Step 602 includes accessing trim settings (or calibration values) of the frequency multiplying circuit 54. These are trim settings from periodic recalibration during one embodiment of the retention mode. These are the trim settings from step 512 of process 500, in one embodiment. In one embodiment, mode and calibration circuit 56 accesses the trim settings from storage 58.

Step 604 includes restarting the self-clock generation circuit 52, if necessary. Note that the self-clock generation circuit 52 is shut down during the majority of the retention mode, in one embodiment. However, there is still a slight chance that the self-clock generation circuit 52 could be running when the input clock returns. Hence, it might not be necessary to restart the self-clock generation circuit 52. The self-clock generation circuit 52 may be restarted based on parameters that were saved during the initialization process. In one embodiment, the trim settings from step 412 of process 400 are used.

Step 606 includes initializing the frequency multiplying circuit 54 using the saved trim settings. Note that these trim settings are from the periodic recalibration during the retention mode (e.g., from step 512).

Step 608 is to provide the reference clock to the frequency multiplying circuit 54. In one embodiment, the output of the self-clock generation circuit 52 is connected to the input of the frequency multiplying circuit 54, such that step 508 happens in response to the self-clock generation circuit 52 outputting the reference clock.

Step 610 includes the frequency multiplying circuit 54 locking to the reference clock. Note that since the saved trimmed settings from the most recent calibration period were used, the frequency multiplying circuit 54 achieves rapid locking to the reference clock.

Step 612 includes saving trim settings of the frequency multiplying circuit 54. In one embodiment, mode and calibration circuit 56 saves the trim settings to storage 58.

Step 614 includes the retiming circuit 50 outputting a retimed clock. The retimed clock could be the clock that it output from the frequency multiplying circuit 54, or could be based on the clock that it output from the frequency multiplying circuit 54. Note that step 614 could include outputting more than one retimed clock. For example, retiming circuit 800 in FIG. 8 outputs two retimed clocks "SOC_CLK" and "DLLOUT_CLK."

The retiming circuit 50 stays in the normal mode and continues to output the retimed clock at least until the input clock is lost, in one embodiment. If the input clock is lost, then the retiming circuit 50 enters the retention mode. Thus, process 500 may be performed.

Figure 7:
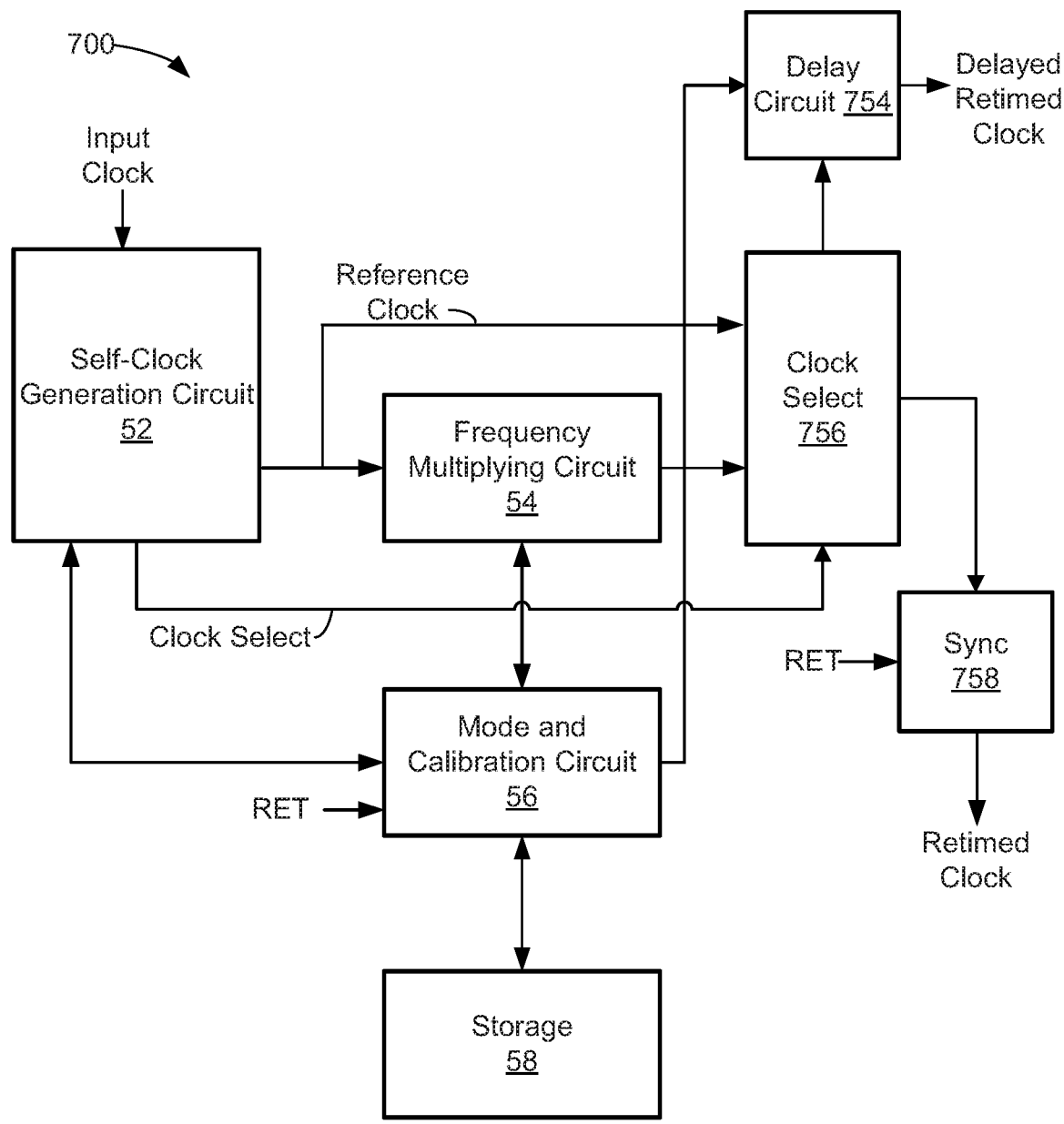
FIG. 7 is a diagram of one embodiment of a retiming circuit.

FIG. 7 is a diagram of one embodiment of a retiming circuit 700. This retiming circuit 700 has some elements in common with retiming circuit 50 of FIG. 1A, and hence uses some common reference numbers. Retiming circuit 700 adds a clock select component 756, a delay circuit 754, and synchronization (sync) component 758. Retiming circuit 700 could be used in place of retiming circuit 50 in the Active MUX 70 in FIG. 1B or 3B.

In some cases, the self-clock generation circuit 52 might be able to generate a reference clock having an adequate frequency. For example, the self-clock generation circuit 52 might be able to match the frequency of the reference clock to the frequency of the input clock. In this case, then the frequency multiplying circuit 54 is not needed, in one embodiment. Note that in an example in which the retiming circuit is used in a memory system, the desired data transfer rate can vary. For example, if the desired rate is 533 MHz, the self-clock generation circuit 52 might be able to generate a reference clock of 533 MHz. However, the self-clock generation circuit 52 might not be able to generate a reference clock that meets a desired 1600 MHz data transfer rate.

The clock select module 756 is configured to select either a reference clock directly from the self-clock generation circuit 52 or a clock from the frequency multiplying circuit 54. One input of the clock select module 756 receives a reference clock directly from the self-clock generation circuit 52. Another input of the clock select module 756 receives a clock from the frequency multiplying circuit 54. The self-clock generation circuit 52 sends a clock select signal to the clock select module 756 to select one of the clock select module's inputs. Thus, the self-clock generation circuit 52 determines whether to use the reference clock it generated or the retimed clock from the frequency multiplying circuit 54.

Retiming circuit 700 outputs two retimed clocks. The clock select module 756 outputs a retimed clock, and the delay circuit 754 outputs a delayed retimed clock. The delay circuit 754 is configured to change the phase of the retimed clock by 90 degrees, in one embodiment. The delay circuit 754 is configured to delay the retimed clock by 90 degrees, in one embodiment.

The synchronizer 758 is configured to prevent glitches in the retimed clock. The synchronizer 758 inputs a retention signal (RET) that indicates whether or not the retiming circuit 700 should be in the retention mode. The retention signal may be generated by any hardware or software that detects the presence/absence of the input clock. As one example, core logic 60 generates RET. Note that in circuit 700, RET is provided to the mode and calibration circuit 56. However, another option is for mode and calibration circuit 56 to generate RET based on whether the input clock is present.

FIG. 8 is a diagram of one embodiment of a retiming circuit 800. Retiming circuit 800 shows further details of one embodiment of retiming circuit 700. In one embodiment, the retiming circuit 800 is used for retiming circuit 50 in the active MUX 70 in FIG. 1B. In one embodiment, the retiming circuit 800 is used for retiming circuit 50 in the active MUX 70 in FIG. 3B. In one embodiment, the retiming circuit 800 is used for retiming circuit 50 in the active MUX 70 in FIG. 11. However, the retiming circuit 800 could be used for other applications. The retiming circuit 800 inputs DQS, which is one example of an input clock. In one embodiment, DQS comes from the memory controller 122. Note that DQS may be a data strobe signal. The retiming circuit 800 outputs two retimed clocks (SOC_CLK) and DLLOUT_CLK). DLLOUT_CLK is delayed 90 degrees in phase from SOC_CLK, in one embodiment. The retiming circuit 800 also inputs several control signals (EN, RET, SOC_CTRL). The control signals are generated by core logic 60, in one embodiment. The enable signal (EN) is generated in response to detecting a power on reset, in one embodiment. The retention signal (RET) is used to put the retiming circuit 800 into a retention mode, and back into a normal mode. The retention signal (RET) may be generated based on the presence/absence of DQS. The SOC control signal (SOC_CTRL) is used to facilitate generation of DLLOUT_CLK.

The high-frequency oscillator 802, state machine 804, and inverter 806 are components within one embodiment of a self-clock generation circuit 52. The high-frequency oscillator 802 outputs a reference clock at the reference clock output (REF). The high-frequency oscillator 802 may be, for example, a high-frequency oscillator, a high-frequency relaxation oscillator, an RC oscillator circuit, an LC oscillator circuit, etc. The high-frequency oscillator 802 has an enable input (EN), which enables its operation, in one embodiment. The high-frequency oscillator 802 has a retention mode input (RET), which is used to disable the high-frequency oscillator 802 during the retention mode, in one embodiment. The high-frequency oscillator 802 is configured to stop outputting the reference clock when the signal at the RET input is high, in one embodiment. The trim settings input (TRIM_HF) may be used to provide trim settings to adjust the frequency of the reference clock.

Inverter 806 is connected to the RET input of high-frequency oscillator 802. The inverter 806 receives a retention mode calibration signal (RET_CAL). The RET_CAL signal is used during the retention mode to indicate whether it is a low current period or a calibration period. During the low current period, the RET_CAL is used to put the high-frequency oscillator 802 into a low current mode in which the reference clock is not output. During the calibration period, the RET_CAL signal is used to put the high-frequency oscillator 802 into a mode in which the reference clock is output.

The state machine 804 performs several functions, in one embodiment. The state machine 804 may detect the frequency of the input clock, may trim the high-frequency oscillator 802, and may select a frequency mode. The state machine 804 has an enable input (EN) to enable its operation. The state machine 804 could be implemented with hardware, software, or some combination of hardware and software.

The state machine 84 has a first clock input (C1) that receives the input clock (DQS), and a second clock input (C2) that is connected to the REF output of the high-frequency oscillator 802 in order to receive the reference clock from the high-frequency oscillator 802. The state machine 84 is configured to compare the frequency of the two clocks, and to send trim settings to the high-frequency oscillator 802 to adjust the frequency of the reference clock. The state machine 804 has a trim setting output (TRIM_S) connected to the trim setting input (TRIM_HF) of the high high-frequency oscillator 802 in order to provide the trim settings. In one embodiment, the state machine 804 has a first counter that counts clock pulses of the input clock (DQS) for some time period, and a second counter that counts clock pulses of the reference clock for the same time period. The state machine 804 then adjusts the trim settings of the high-frequency oscillator 802 to increase or decrease the frequency of the reference clock. The state machine 804 may attempt to get the two clocks to match in frequency. If that is not possible, then the state machine 804 may attempt to have the frequency of the reference clock be some fraction of the input clock frequency. The state machine 804 saves the values of the trim bits, in one embodiment. The trim bits may be saved in volatile or non-volatile storage (such as storage 58, which is not expressly depicted in FIG. 8)

As noted, the state machine 804 may select a frequency mode. This frequency mode controls whether or not the locked loop 808 is used. The state machine 804 outputs a frequency mode signal at a frequency mode (FM) output. The frequency mode signal is based on the frequency relationship of the input clock and reference clock. For example, if the reference clock is half the frequency of the input clock, then an X2 mode signal is issued. In one embodiment, the frequency mode signal has two values, one for an X2 mode and one for a normal mode.

The locked loop 808, MUX 810, and gate 812 are one embodiment of a frequency multiplying circuit 54. The locked loop 808 could be, but is not limited to, a phase-locked loop, a delay-locked loop, or a frequency-locked loop. The locked loop 808 has a REF input connected to the output of the high-frequency oscillator 802, such that the locked loop 808 may receive the reference clock. The locked loop 808 has an enable input (EN), which enables its operation. Note that the enable input is connected to the FM output of the state machine 804, such that the enable input receives the frequency mode signal. In the embodiment depicted in FIG. 8, the frequency mode signal may have just two values. Thus, either the locked loop 808 is enabled in a frequency mode (e.g., X2 mode), or the locked loop 808 is not enabled. However, the frequency mode signal could have more than two values, in which case there may be additional frequency modes (e.g., X2, X4) The locked loop 808 has a calibration input (CAL), which instructs the locked loop 808 to calibrate itself with respect to the reference signal. For example, after locking to the reference signal, the locked loop 808 may provide trim settings, which may be saved to storage. The locked loop 808 outputs a retimed clock on its retimed clock output (RET_CK).

MUX 810 has one input (labeled "1") connected to the output (RET_CK) of the locked loop 808 in order to receive the retimed clock output of the locked loop 808. MUX 810 has a second input (labeled "0") connected to the output of the high-frequency oscillator 802 to receive the reference clock. The MUX 810 has a select input connected to the FM output of the state machine 804, such that the multiplier mode signal selects one of the inputs of the MUX 810. In one embodiment, when in an X2 mode, the MUX 810 passes the clock signal from the locked loop 808; when in a normal mode, the MUX 810 passes the reference clock from the high-frequency oscillator 802. The output of the MUX is referred in FIG. 8 as an internal clock (INT_CLK). Note that INT_CLK is based on the retimed clock from the locked loop 808, and hence is one embodiment of a retimed clock.

Low frequency oscillator 814, calibration signal generator 816, and logic gate 818 are some of the elements of one embodiment of mode and calibration circuit 56. Logic gate 818 has a first input that receives the enable signal (EN) and a second input that receives the retention signal (RET). The output of logic gate 818 is thus the logical AND of EN and RET. The output of logic gate 818 demarks the retention mode, in one embodiment.

Low frequency oscillator 814 is a ring oscillator, in one embodiment. Low frequency oscillator 814 has an input (RET) that is connected to the output of logic gate 818. Low frequency oscillator 814 outputs a low frequency clock at its low frequency clock (LFC) output. As one example, the low frequency clock might be about 1 Khz, but the low frequency clock could have a higher or lower frequency.

Calibration signal generator 816 has an input (C_IN) that is connected to the LFC output of the low frequency oscillator 814 in order to receive the low frequency clock. Calibration signal generator 816 has an input (RET) that is connected to the output of logic gate 818. Calibration signal generator 816 is configured to generate a retention calibration signal (RET_CAL) at its output (C_OUT). The calibration signal generator 816 establishes the period and duty cycle of RET_CAL, in one embodiment. The period of RET_CAL may be used to select how frequently the locked loop 808 will be calibrated during the retention mode. The duty cycle of RET_CAL may be used to select the duration of the actual calibration. Note that the duty cycle can be quite low, such that very little current is consumed during the retention mode.

The calibration signal generator 816 may manipulate the low frequency clock to create RET_CAL. The calibration signal generator 816 divides the low frequency clock by "N", in one embodiment, to establish the period of RET_CAL. The calibration signal generator 816 may establish the duty cycle of RET_CAL at "M" percent. The values for N and/or M are programmable, in one embodiment.

As noted, the retention calibration signal (RET_CAL) is used to cause the locked loop 808 to be periodically calibrated during the retention mode. The output (C_OUT) of the calibration signal generator 816 is connected to one of the inputs of logic gate 812 in order to provide RET_CAL. The other input of logic gate 812 is connected to the FM output of state machine 804 to receive the frequency mode signal. The output of logic gate 812 is connected to the calibration input (CAL) of locked loop 808. Thus, when the retiming circuit is in the X2 mode and the calibration signal (RET_CAL) is high, the locked loop 808 is instructed to calibrate itself to the reference clock. For example, the locked loop 808 may lock to the reference clock and report trim settings, which can be saved in storage (e.g., storage 58).

The retention calibration signal (RET_CAL) is also provided to the input of inverter 806, which inverts the retention calibration signal (RET_CAL) and provides the inverted signal to the RET input of the high frequency oscillator 802. This has the effect of preventing the high frequency oscillator 802 from producing the reference signal during the retention mode, except when the locked loop 808 is being calibrated.

Master delay-locked loop (master DLL) 524 and slave delay-locked loop (slave DLL) 526 are components included in one embodiment of delay circuit 754 of retiming circuit 700. As noted, the delay circuit 754 is configured to change (e.g., delay) the phase of the retimed clock by 90 degrees, in one embodiment. The master delay-locked loop 524 has a clock input (CK) that is connected to the output of MUX 810 to receive the internal clock (INT_CLK). The master delay-locked loop 524 may have a phase comparator to compare the phase of the internal clock with DLLOUT_CLK, in one embodiment.

The output (DLYO) of the master DLL 524 is connected to an input (DLYI) of the slave DLL 526. The master DLL 524 outputs a delay control signal at its delay output (DLYO) to the slave DLL 526 to control the delay of the slave DLL 526. The master DLL 524 includes a chain of one or more delay gates, in one embodiment. The slave DLL 526 includes a chain of one or more delay gates, in one embodiment. In one embodiment, the delay is adjusted by selecting the number of inverters in the chain. Note that the master and slave DLLs 524, 526 can be implemented in a variety of ways including analog, digital, or mixed signal (analog and digital). The slave DLL 524 inputs the SOC_CLK at its clock input (CK).

The master DLL 524 receives control signals labeled SOC_CTRL. These control signals may include an enable signal used to, for example, instruct the master DLL 524 to turn on. The other control signals may be specific to how the master DLL 524 is implemented.

The master delay-locked loop 524 has a CAL input that is connected to the output of the calibration signal generator 816 to receive RET_CAL. The RET_CAL signal causes the master DLL 524 to periodically calibrate during the retention mode. As noted above, the RET_CAL signal may be used to delineate between a low current period and a calibration period of the retention mode. Thus, the master delay-locked loop 524 may calibrate the delay circuit 754 during the calibration period. Trim settings from this calibration may be saved to storage 58. In one embodiment, these trim settings are used when the normal mode is entered to initialize the master and/or slave DLL 524, 526.

The synchronizer 820 and logic gate 822 are components of one embodiment of sync 758 of retiming circuit 700. The synchronizer 820 is configured to prevent glitches in the retimed clocks (e.g., SOC_CLK, DLLOUT_CLK). When the retention signal (RET) changes, there should not be any glitch in either of the retimed clocks (SOC_CLK, DLLOUT_CLK). The synchronizer 820 has an input (RET) connected to the output of the logic gate 818. The synchronizer 820 has a clock input (SYNC CLK) connected to the output of MUX 810 in order to receive the internal clock (INT_CLK). The synchronizer 820 has a clock output (S_OUT) connected to an input of logic gate 822. The synchronizer 820 provides a synchronized replica of the RET signal with respect to INT_CLK, in one embodiment. The synchronizer 820 may prevent glitches in SOC_CLK and/or DLLOUT_CLK. The synchronizer 820 shuts off the SOC_CLK and DLLOUT_CLK during one embodiment of the retention mode. Therefore, current and/or power is saved. However, note the INT_CLK may be running during the calibration phase of the retention mode. Logic gate 822 has its other input connected to the output of the output of MUX 810 in order to receive the internal clock (INT_CLK). Gate 822 has an output that provides SOC_CLK.

Figure 9:
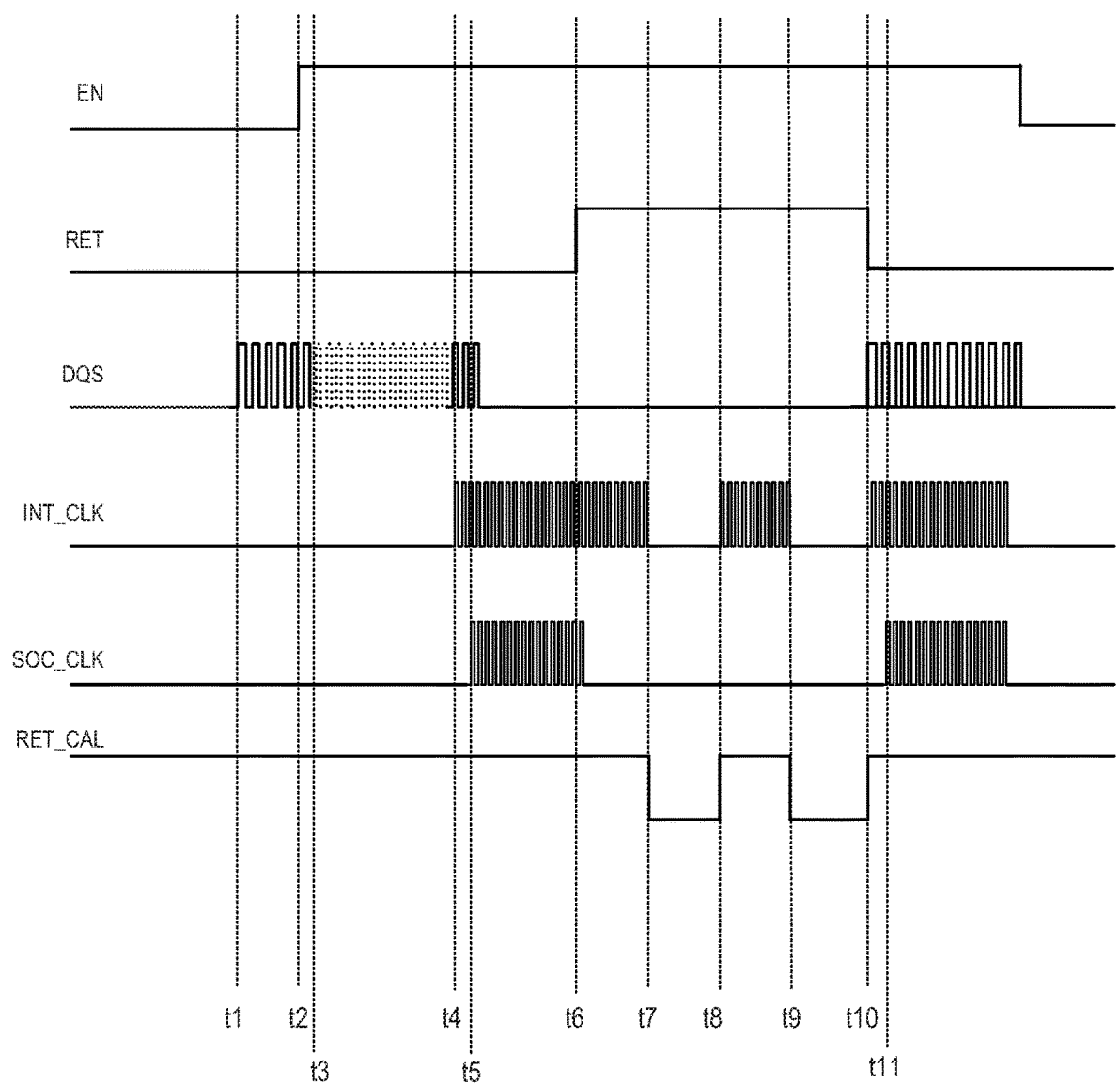
FIG. 9 is a timing diagram of one embodiment of signals in retiming circuit of FIG. 8.

FIG. 9 is a timing diagram of one embodiment of signals in retiming circuit 800 of FIG. 8. The enable signal (EN) and the retention mode signal (RET) are provided by core logic 60, in one embodiment. Other circuitry can be used to provide EN and RET.

At time t1, the input clock DQS becomes present. In one embodiment, the memory controller 122 provides DQS to the active MUX 70.

At time t2, the enable signal EN becomes active. In one embodiment, core logic 60 detects DQS and sets EN accordingly.

The time between t3 and t4 represents the high-frequency oscillator 802 turning on, generating the proper frequency for the reference clock, the locked-loop 808 locking to the reference clock, and the locked-loop 808 generating the internal clock (INT_CLK). Note that by time t4, INT_CLK is available. Also note that the trim settings for both the high-frequency oscillator 802 and the locked-loop 808 may be saved into storage 58 (e.g., a register or the like).

At time t5, the retimed clock SOC_CLK is available. The small delay between INT_CLK being available at time t4 and SOC_CLK may be due to logic gate 822.

At time t6, the retention signal RET goes high. The retention signal RET may go high in response to the absence of the clock signal (at, for example, time t5). However, note that RET may be delayed for a pre-determined time after DQS has stopped toggling. This allows the retimed clock to remain available. For example, SOC_CLK remains available between time t5 and t6. In one embodiment, SOC_CLK is used by core logic 60 after DQS is no longer toggling. In one embodiment, SOC_CLK is used for Retimed Clock A in FIG. 1B.

In one embodiment, the retention mode is demarked by the RET signal. Thus, the retention mode may be defined as the period between t6 until time t10. The retention mode has a low current period and a calibration period, as will be described below. The low current period is between time t7 and t8, and again between time t9 and t10. The calibration period is between time t8 and t9. Note that there may be many calibration periods within the retention mode. Note that the retention mode is entered in response to DQS no longer being present, in one embodiment.

Between time t6 and t7, the internal clock (INT_CLK) is still available. This is because the high-frequency oscillator 802 and locked loop 808 may continue to run for a pre-determined number of clock cycles at the beginning of the retention mode. Note that after time t6, SOC_CLK is no longer toggling. This is due to the impact of the synchronizer 820, in one embodiment. Note that SOC_CLK is not running during the retention mode between times t6 and t11, which saves power. Also, note that with reference to FIG. 8 that DLLOUT_CLK does not run between time t6 and t11, which also saves power.

At time t7, RET_CAL goes low. Note that RET_CAL may be provided by the calibration signal generator 816. Note that INT_CLK is no longer generated when RET_CAL is low. With reference to the retiming circuit 800, when RET_CAL goes low, the high-frequency oscillator 802 is instructed to stop outputting the reference clock. Hence, the locked-loop 808 no longer has a reference clock to lock to. Hence, the locked-loop 808 no longer outputs a retimed clock.

Between times t8 and t9, RET_CAL is high. Note that INT_CLK is again present while RET_CAL is high. This is the calibration period. With reference to the retiming circuit 800, when RET_CAL is again high, the high-frequency oscillator 802 is instructed to output the reference clock. Hence, the locked-loop 808 has a reference clock to lock to. Also, the CAL input of the locked-loop 808 instructs the locked-loop 808 to lock to reference clock and provide trim settings. Note that trim settings from the locked-loop 808 locking to the reference clock may be saved. Also, note that with reference to FIG. 8 that INT_CLK is provided to the master DLL 524 during the calibration phase between times t8 and t9. Also note that DLYO output of master DLL 524 may be toggling between t8 and t9. However, the CK input of the slave DLL 526 (which receives SOC_CLK) does not toggle between t8 and t9.

At time t10, the retention mode is over. Note that the retention mode is left in response to DQS again being present, in one embodiment. Thus, time t10 may represent the start of the normal mode. Note the internal clock is again present at time t10. Also, SOC_CLK is present at time 11, a short time after the retention mode is left. Note that the looked-loop 808 is able to lock to the reference clock very quickly, thereby allowing INT_CLK to be generated quickly upon entering the normal mode. Further note that the locked-loop 808 trim settings from the most recent calibration phase are used to initialize the locked-loop 808 at the beginning of the normal mode, in one embodiment, to achieve fast locking.

Figure 10:
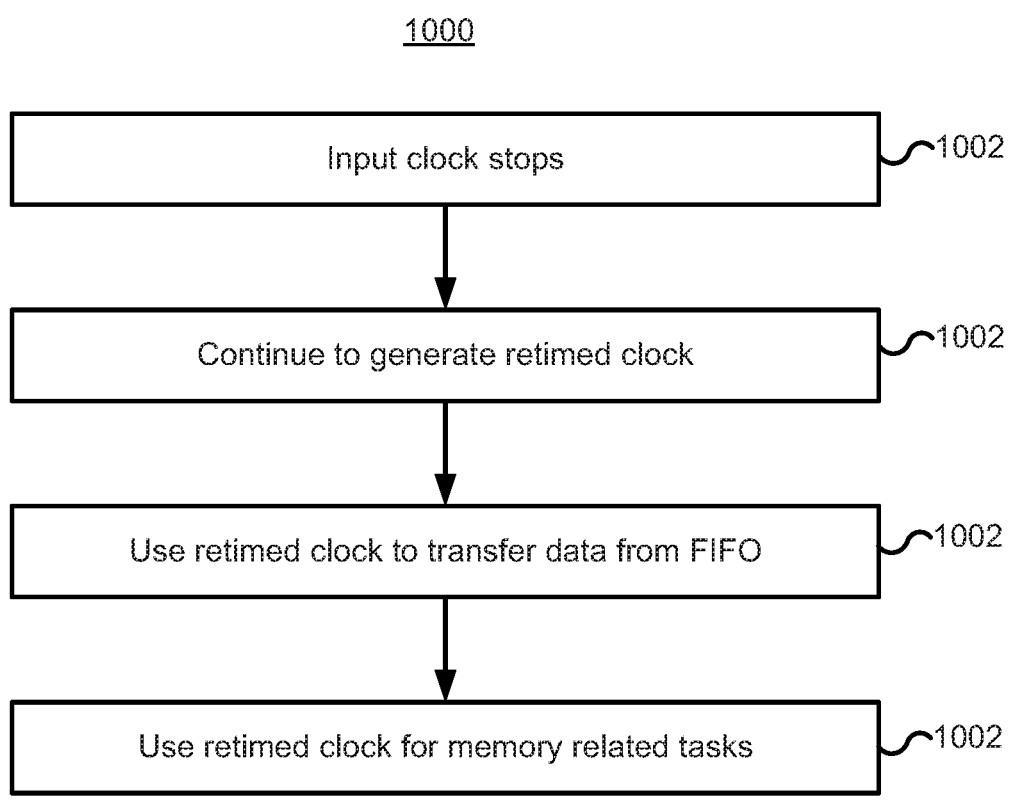
FIG. 10 is a flowchart of one embodiment of a process of continuing to generate and use a retimed clock after the input clock is no longer present.

As noted above, after the input clock is no longer present, the retimed clock continues to be generated in one embodiment. FIG. 10 is a flowchart of one embodiment of a process 1000 of continuing to generate and use a retimed clock after the input clock is no longer present. Process 1000 may be used in a memory system 100, such as the memory system of FIG. 1B. One embodiment of Active MUX 70 has FIFOs, which are used to temporarily store data being transferred from memory controller 122 to memory dies 108. Process 1000 describes how the data in the FIFOs can continue to be transferred after the input clock is no longer available.

Step 1002 indicates the condition that the input clock is no longer present. This is detected by core logic 60, in one embodiment. Note that the input clock may be a data strobe signal from the memory controller 122.

Step 1004 includes continuing to generate the retimed clock. Step 1004 is performed for a certain number of clock cycles in one embodiment. In one embodiment, the self-clock generation circuit 52 and the frequency multiplying circuit 54 are continued to be operated after the input clock is no longer present in order to continue to generate the retimed clock. In one embodiment, the high-frequency oscillator 802 and the locked loop 808 are continued to be operated after the input clock (e.g., DQS) is no longer present in order to continue to generate the retimed clock.

Step 1006 includes using the retimed clock to transfer data out of a FIFO. In one embodiment, core logic 60 uses the retimed clock to transfer data in or out of a FIFO.

Step 1008 includes using the retimed clock for memory related tasks. The memory related tasks refers to memory cells in the memory dies 108, in one embodiment. For example, the retimed clock might be used for garbage collection. In one embodiment, core logic 60 uses the retimed clock for memory related task.

Figure 11:
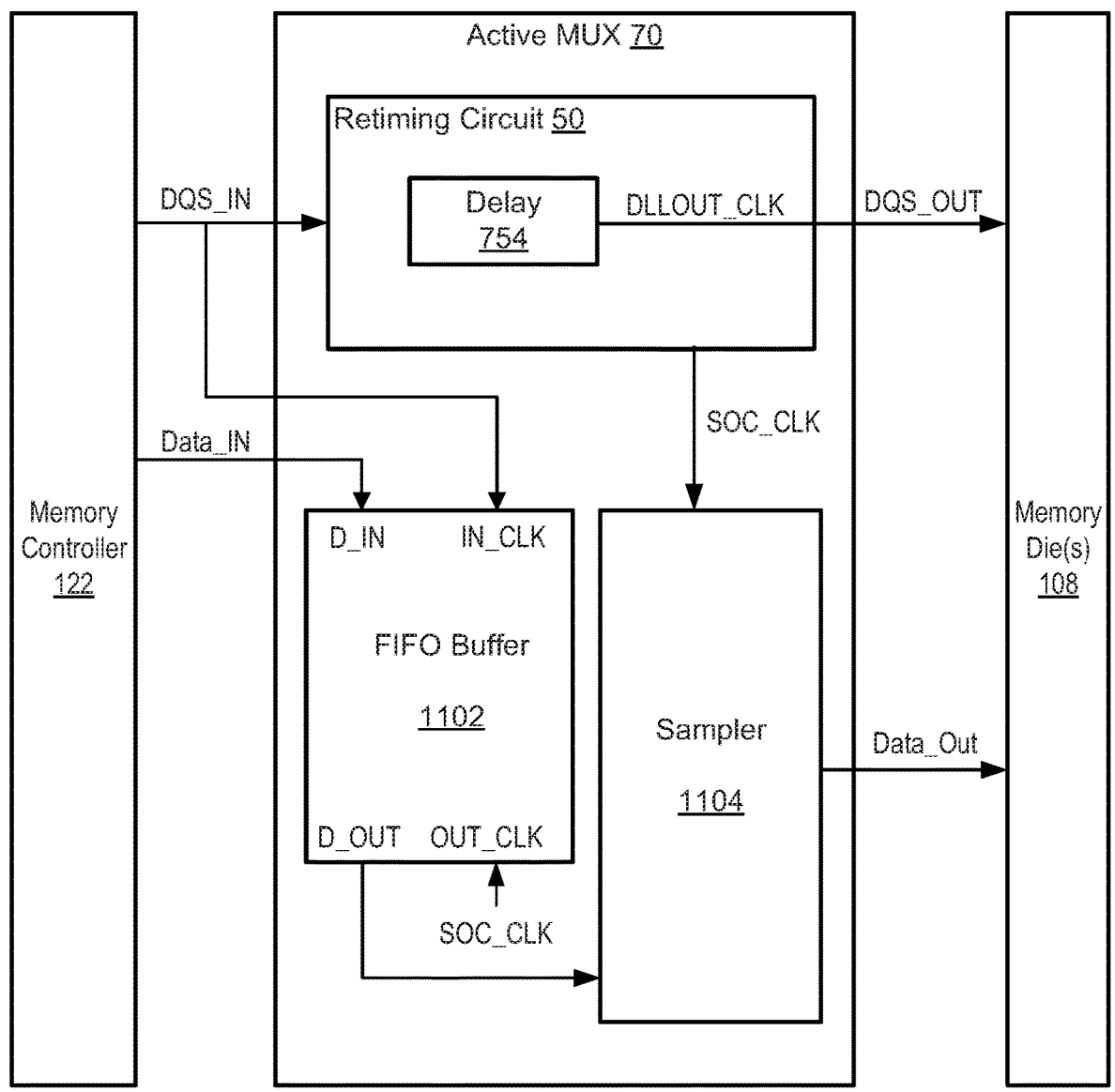
FIG. 11 is a block diagram of one embodiment of a memory system having an Active MUX with a retiming circuit.

FIG. 11 is a block diagram of one embodiment of a memory system 100 having an Active MUX 70 with a retiming circuit 50. The Active MUX 70 inputs DQS_IN from the memory controller 122, and generates retimed clocks SOC_CLK and DLLOUT_CLK. The retimed clock DLLOUT_CLK is provided to the memory dies 108 as DQS_OUT. In one embodiment, retiming circuit 800 is used to generate SOC_CLK and DLLOUT_CLK. However, the retiming circuit 50 in FIG. 11 is not limited to retiming circuit 800. The Active MUX 70 in FIG. 11 is one embodiment of the Active MUX 70 in FIG. 1B.

The Active MUX 70 in FIG. 11 also has a FIFO buffer 1102 and a sampler 1104. The FIFO buffer 1102 may be included in one embodiment of front end I/Os 62 of FIG. 1B.

The sampler 1104 may be included in one embodiment of back end I/Os 64 of FIG. 1B. The core logic 60 is not depicted in FIG. 11; however, note that the Active MUX 70 in FIG. 11 may have core logic 60 to control FIFO buffer 1102 and sampler 64 by, for example, providing clocks (e.g., SOC_CLK and DLLOUT_CLK).

The FIFO buffer 1102 inputs data (Data_IN) from the memory controller 122 at its data input D_IN. In one embodiment, the data input D_IN is an eight bit wide data bus. The FIFO buffer 1102 inputs the input clock DQS_IN from the memory controller 122. Note that DQS in FIG. 8 may be DQS_IN. The retimed clock SOC_CLK is provided to an output clock (OUT_CLK) of the FIFO buffer 1102 in order to clock out the data at the data output D_OUT. The data is provided to the sampler 1104.

The sampler 1104 is a set of flip-flops to latch the data from the FIFO buffer 1102 to the memory die 108, in one embodiment. The sampler 1104 inputs the retimed clock SOC_CLK. The sampler 1104 latches the data on the rising edge of SOC_CLK, in one embodiment. Thus, the sampler 1104 provides Data Out to the memory dies 108.

One embodiment disclosed herein includes an apparatus comprising: non-transitory storage, a self-clock generation circuit, a frequency multiplying circuit coupled to the self-clock generation circuit, and a mode and calibration circuit coupled to the self-clock generation circuit and the frequency multiplying circuit. The self-clock generation circuit is configured to output a reference clock having a frequency that is based on a frequency of an input clock. The frequency multiplying circuit is configured to lock to the reference clock and to output a retimed clock that has a frequency that is based on a multiple of the reference clock frequency. The mode and calibration circuit is configured to: i) operate the self-clock generation circuit and the frequency multiplying circuit in a retention mode in response to the input clock no longer being present; ii) instruct the self-clock generation circuit to not output the reference clock during the retention mode except during a calibration period; and iii) store, into the non-transitory storage, calibration values from locking the frequency multiplying circuit to the reference clock during the calibration period.

In a second embodiment, in furtherance of the first embodiment, the mode and calibration circuit is further configured to use the calibration values from the non-transitory storage to initialize the frequency multiplying circuit responsive to the input clock again being present.

In a third embodiment, in furtherance of the first or second embodiments the mode and calibration circuit is further configured to: i) operate the self-clock generation circuit and the frequency multiplying circuit in a normal mode in response to the input clock again being present after the retention mode; ii) instruct the self-clock generation circuit to output the reference clock during the normal mode; and iii) use the calibration values from the non-transitory storage to initialize the frequency multiplying circuit when entering the normal mode.

In a fourth embodiment, in furtherance of any of the first to third embodiments, the self-clock generation circuit is further configured to: i) synchronize the reference clock to have a frequency that is a fraction of the input clock frequency; ii) store reference clock generation values from synchronizing the reference clock to the input clock; and iii) apply the reference clock generation values during the retention mode to cause the reference clock to have a frequency that is the fraction of the input clock frequency.

In a fifth embodiment, in furtherance of any of the first to fourth embodiments, the apparatus further comprises a synchronizer configured to prevent glitches in the retimed clock when switching between the retention mode and a normal mode.

In a sixth embodiment, in furtherance of any of the first to fifth embodiments, the apparatus is configured to continue to provide the retimed clock for at least a predetermined number of clock cycles after the input clock is no longer present.

In a seventh embodiment, in furtherance of any of the first to sixth embodiments, the apparatus further comprises a delay circuit configured to generate a delayed version of the retimed clock during the retention mode.

In an eighth embodiment, in furtherance of any of the first to seventh embodiments, the apparatus further comprises a memory controller configured to provide the input clock, wherein the input clock is a data strobe signal.

In a ninth embodiment, in furtherance of the eighth embodiment, the apparatus further comprises a memory die; and core logic configured to use the retimed clock to control transfer of data from the memory controller to the memory die.

One embodiment includes a method of operating a clock retiming circuit. The method comprises: i) operating the clock retiming circuit in a normal mode in response to an input clock being available to the clock retiming circuit; and ii) operating the clock retiming circuit in a retention mode in response to the input clock no longer being available to the clock retiming circuit. The retention mode has a low current period and a calibration period. Operating the clock retiming in the normal mode comprises: i) outputting a reference clock, by a self-clock generation circuit, based on a frequency of the input clock; and ii) generating a retimed clock based on locking a frequency multiplying circuit to the reference clock, the retimed clock having a frequency that is based on a multiple of the reference clock. Operating the clock retiming in the retention mode comprises: i) instructing the self-clock generation circuit to not output the reference clock during the low current period and to output the reference clock during the calibration period; ii) calibrating the frequency multiplying circuit to the reference clock during the calibration period; and iii) storing, to non-transitory storage, calibration values from the frequency multiplying circuit locking to the reference clock during the calibration period.

One embodiment includes a clock retiming circuit, comprising: non-transitory storage; mode means for operating the clock retiming circuit in a normal mode in response to an input clock being available to the clock retiming circuit and a retention mode in response to the input clock is no longer available to the clock retiming circuit; reference clock generating means for generating a reference clock having a frequency that is based on a frequency of the input clock; locking means for locking to the reference clock and for generating a retimed clock that has a frequency that is based on a multiple of the reference clock frequency; and calibration means for: i) instructing the reference clock generating means to not output the reference clock during the retention mode except during a calibration period of the retention mode; ii) calibrating the locking means to the reference clock during the calibration period; and iii) storing, into non-transitory storage, calibration values from locking the locking means to the reference clock during the calibration period.

Herein, mode means may include one or more of mode and calibration circuit 56, core logic 60, logic gate 818, low frequency oscillator 814, calibration signal generator 816, logic gate 818, inverter 806, an application specific integrated circuit (ASIC), a Field Programmable Gate Array (FPGA), a circuit, a digital logic circuit, an analog circuit, a combination of discrete circuits, gates, or any other type of hardware or combination thereof. The mode means may comprise other hardware and/or software.

Herein, reference clock generating means may include one or more of self-clock generation circuit 52, high-frequency oscillator 802, a high-frequency relaxation oscillator, an RC oscillator circuit, an LC oscillator, state machine 804, inverter 806, an application specific integrated circuit (ASIC), a Field Programmable Gate Array (FPGA), a circuit, a digital logic circuit, an analog circuit, a combination of discrete circuits, gates, or any other type of hardware or combination thereof. The reference clock generating means may comprise other hardware and/or software.

Herein, locking means may include one or more of frequency multiplying circuit 54, locked loop 808, MUX 810, and gate 812, a phase-locked loop, a delay-locked loop, a frequency-locked loop, an application specific integrated circuit (ASIC), a Field Programmable Gate Array (FPGA), a circuit, a digital logic circuit, an analog circuit, a combination of discrete circuits, gates, or any other type of hardware or combination thereof. The locking means may comprise other hardware and/or software.

Herein, calibration means may include one or more of mode and calibration circuit 56, core logic 60, logic gate 818, low frequency oscillator 814, calibration signal generator 816, logic gate 818, inverter 806, logic gate 812, an application specific integrated circuit (ASIC), a Field Programmable Gate Array (FPGA), a circuit, a digital logic circuit, an analog circuit, a combination of discrete circuits, gates, or any other type of hardware or combination thereof. The mode means may comprise other hardware and/or software.

Herein, synchronization means for preventing glitches in the retimed clock when switching between from the retention mode to the normal mode may include one or more of sync 758, synchronizer 820, logic gate 822, an application specific integrated circuit (ASIC), a Field Programmable Gate Array (FPGA), a circuit, a digital logic circuit, an analog circuit, a combination of discrete circuits, gates, or any other type of hardware or combination thereof. The mode means may comprise other hardware and/or software.

Herein, synchronization means for preventing glitches in the retimed clock when switching between from the retention mode to the normal mode may include one or more of sync 758, synchronizer 820, logic gate 822, an application specific integrated circuit (ASIC), a Field Programmable Gate Array (FPGA), a circuit, a digital logic circuit, an analog circuit, a combination of discrete circuits, gates, or any other type of hardware or combination thereof. The mode means may comprise other hardware and/or software.

Herein, clock detection means may include one or more of high-frequency oscillator 802, a high-frequency relaxation oscillator, an RC oscillator circuit, an LC oscillator, state machine 804, an application specific integrated circuit (ASIC), a Field Programmable Gate Array (FPGA), a circuit, a digital logic circuit, an analog circuit, a combination of discrete circuits, gates, or any other type of hardware or combination thereof. The reference clock generating means may comprise other hardware and/or software.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   non-transitory storage;
   a self-clock generation circuit configured to output a reference clock having a frequency that is based on a frequency of an input clock;
   a frequency multiplying circuit coupled to the self-clock generation circuit and configured to lock to the reference clock, the frequency multiplying circuit configured to output a retimed clock that has a frequency that is based on a multiple of the reference clock frequency;
   a mode and calibration circuit coupled to the self-clock generation circuit and the frequency multiplying circuit, the mode and calibration circuit configured to:
   i) operate the self-clock generation circuit and the frequency multiplying circuit in a retention mode in response to the input clock no longer being present;
   ii) instruct the self-clock generation circuit to not output the reference clock during the retention mode except during a calibration period; and
   iii) store, into the non-transitory storage, calibration values from locking the frequency multiplying circuit to the reference clock during the calibration period.

2. The apparatus of claim 1, wherein the mode and calibration circuit is further configured to:
   use the calibration values from the non-transitory storage to initialize the frequency multiplying circuit responsive to the input clock again being present.

3. The apparatus of claim 1, wherein the mode and calibration circuit is further configured to:
   i) operate the self-clock generation circuit and the frequency multiplying circuit in a normal mode in response to the input clock again being present after the retention mode;
   ii) instruct the self-clock generation circuit to output the reference clock during the normal mode; and
   iii) use the calibration values from the non-transitory storage to initialize the frequency multiplying circuit when entering the normal mode.

4. The apparatus of claim 1, wherein the self-clock generation circuit is further configured to:
   i) synchronize the reference clock to have a frequency that is a fraction of the input clock frequency;
   ii) store reference clock generation values from synchronizing the reference clock to the input clock; and
   iii) apply the reference clock generation values during the retention mode to cause the reference clock to have a frequency that is the fraction of the input clock frequency.

5. The apparatus of claim 1, further comprising a synchronizer configured to:
   prevent glitches in the retimed clock when switching between the retention mode and a normal mode.

6. The apparatus of claim 1, wherein the apparatus is configured to continue to provide the retimed clock for at least a predetermined number of clock cycles after the input clock is no longer present.

7. The apparatus of claim 1, further comprising
   a delay circuit configured to generate a delayed version of the retimed clock during the retention mode.

8. The apparatus of claim 1, further comprising:
   a memory controller configured to provide the input clock, wherein the input clock is a data strobe signal.

9. The apparatus of claim 8, further comprising:
   a memory die; and
   core logic configured to use the retimed clock to control transfer of data from the memory controller to the memory die.

10. A method of operating a clock retiming circuit, the method comprising:
    operating the clock retiming circuit in a normal mode in response to an input clock being available to the clock retiming circuit, the normal mode comprising:
    i) outputting a reference clock, by a self-clock generation circuit, based on a frequency of the input clock; and
    ii) generating a retimed clock based on locking a frequency multiplying circuit to the reference clock, the retimed clock having a frequency that is based on a multiple of the reference clock;
    operating the clock retiming circuit in a retention mode in response to the input clock no longer being available to the clock retiming circuit, the retention mode having a low current period and a calibration period and comprising:
    i) instructing the self-clock generation circuit to not output the reference clock during the low current period and to output the reference clock during the calibration period;
    ii) calibrating the frequency multiplying circuit to the reference clock during the calibration period; and
    iii) storing, to non-transitory storage, calibration values from the frequency multiplying circuit locking to the reference clock during the calibration period.

11. The method of claim 10, wherein the normal mode further comprises using the calibration values from the non-transitory storage to initialize the frequency multiplying circuit responsive to the input clock again being present.

12. The method of claim 10, further comprising:
    detecting a frequency of the input clock that is input to the clock retiming circuit during an initialization phase;

storing, to non-transitory storage, reference clock generation values to operate the self-clock generation circuit of the clock retiming circuit, the reference clock generation values for operating the self-clock generation circuit at a frequency that is based on the detected frequency of the input clock; and using the reference clock generation values to operate the self-clock generation circuit during the normal mode and the retention mode.

13. The method of claim 10, further comprising:

continuing to provide the retimed clock for at least a predetermined number of clock cycles after the input clock is no longer being input to the clock retiming circuit at a start of the retention mode.

14. The method of claim 10, further comprising:

generating a delayed version of the retimed clock during the retention mode, the delayed version being delayed 90 degrees.

15. The method of claim 10, further comprising:

receiving the input clock at the clock retiming circuit from a memory controller; and using the retimed clock to control transfer of data from the memory controller to memory cells.

16. A clock retiming circuit, comprising:

non-transitory storage;

mode means for operating the clock retiming circuit in a normal mode in response to an input clock being available to the clock retiming circuit and a retention mode in response to the input clock is no longer available to the clock retiming circuit;

reference clock generating means for generating a reference clock having a frequency that is based on a frequency of the input clock;

locking means for locking to the reference clock and for generating a retimed clock that has a frequency that is based on a multiple of the reference clock frequency; and calibration means for:
  i) instructing the reference clock generating means to not output the reference clock during the retention mode except during a calibration period of the retention mode;
  ii) calibrating the locking means to the reference clock during the calibration period; and
  iii) storing, into the non-transitory storage, calibration values from locking the locking means to the reference clock during the calibration period.

17. The clock retiming circuit of claim 16, wherein the calibration means is further for using the calibration values from the non-transitory storage to initialize the locking means responsive to the input clock again being available to the clock retiming circuit.

18. The clock retiming circuit of claim 16, further comprising:

synchronization means for preventing glitches in the retimed clock when switching between from the retention mode to the normal mode.

19. The clock retiming circuit of claim 16, further comprising input clock detection means for:
  i) comparing a frequency of the input clock to a frequency of the reference clock;
  ii) instructing the reference clock generating means to increase or decrease the frequency of the reference clock responsive to the comparison;
  iii) storing, to the non-transitory storage, reference clock generation values to operate the reference clock generating means at a frequency that is based on the frequency of the input clock; and
  iv) using the reference clock generation values to operate the reference clock generating means during the normal mode and the retention mode.

20. The clock retiming circuit of claim 16, wherein the input clock is a data strobe signal.

* * * * *